(12) United States Patent
Nakazawa et al.

(10) Patent No.: US 7,482,627 B2
(45) Date of Patent: Jan. 27, 2009

(54) SEMICONDUCTOR DEVICE, AND METHOD OF FABRICATING THE SAME

(75) Inventors: Misako Nakazawa, Kanagawa (JP); Kenji Kasahara, Kanagawa (JP); Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1006 days.

(21) Appl. No.: 10/337,725

(22) Filed: Jan. 8, 2003

(65) Prior Publication Data

US 2003/0132435 A1 Jul. 17, 2003

Related U.S. Application Data

(62) Division of application No. 09/695,410, filed on Oct. 25, 2000, now Pat. No. 6,524,877.

(30) Foreign Application Priority Data

Oct. 26, 1999 (JP) ................ 11-304722

(51) Int. Cl.
   *H01L 29/04* (2006.01)
(52) U.S. Cl. ............................ 257/49; 257/635
(58) Field of Classification Search .......... 257/635, 257/59, 642, 49
   See application file for complete search history.

(56) References Cited

U.S. PATENT DOCUMENTS

| | | | |
|---|---|---|---|
| 5,247,190 A | 9/1993 | Friend et al. | |
| 5,399,502 A | 3/1995 | Friend et al. | |
| 5,583,369 A | 12/1996 | Yamazaki et al. | |
| 5,696,386 A | 12/1997 | Yamazaki | |
| 5,821,138 A | 10/1998 | Yamazaki et al. | |
| 5,893,730 A | 4/1999 | Yamazaki et al. | |

(Continued)

FOREIGN PATENT DOCUMENTS

JP     10-092576     4/1998

(Continued)

OTHER PUBLICATIONS

H. Schenk et al., "Polymers for Light-emitting Diodes," Euro Display Proceedings 1999, pp. 33-37.

(Continued)

*Primary Examiner*—Douglas M Menz
(74) *Attorney, Agent, or Firm*—Eric J. Robinson; Robinson Intellectual Property Law Office, P.C.

(57) ABSTRACT

A crystalline semiconductor film in which the locations and sizes of crystal grains have been controlled, is prepared, and a TFT capable of high speed operation is realized by employing the crystalline semiconductor film as the channel forming region of the TFT. An organic resin film (2 in FIG. 1) having a predetermined shape is provided on a substrate (1), whereupon an inorganic insulating film (3) and an amorphous semiconductor film are formed. Subsequently, the amorphous semiconductor film is crystallized by laser annealing. The material and thickness of the organic resin film (2) in the predetermined shape or those of the inorganic insulating film (3) are properly regulated, whereby the cooling rate of the semiconductor film is lowered to form a first region (4*a*) in which crystal grain diameters are large.

60 Claims, 28 Drawing Sheets

U.S. PATENT DOCUMENTS

| | | |
|---|---|---|
| 5,946,561 A | 8/1999 | Yamazaki et al. |
| 6,057,896 A * | 5/2000 | Rho et al. ............... 349/42 |
| 6,133,073 A | 10/2000 | Yamazaki et al. |
| 6,136,624 A * | 10/2000 | Kemmochi et al. ........ 438/30 |
| 6,242,758 B1 | 6/2001 | Yamazaki et al. |
| 6,268,695 B1 | 7/2001 | Affinito |
| 6,271,543 B1 | 8/2001 | Ohtani et al. |
| 6,281,552 B1 | 8/2001 | Kawasaki et al. |
| 6,291,275 B1 | 9/2001 | Yamazaki et al. |
| 6,380,011 B1 | 4/2002 | Yamazaki et al. |
| 6,429,053 B1 | 8/2002 | Yamazaki et al. |
| 2001/0019133 A1 | 9/2001 | Konuma et al. |
| 2001/0045558 A1 | 11/2001 | Kawasaki et al. |

FOREIGN PATENT DOCUMENTS

| | | |
|---|---|---|
| JP | 2000-058841 | 2/2000 |
| WO | WO 90/13148 | 11/1990 |

OTHER PUBLICATIONS

R. Ishihara et al., "Location Control of Large Grain Following Excimer-Laser Melting of Si Thin-Films," Jpn. J. Appl. Phys., vol. 37, Part 1, No. 3B, Mar. 1998, pp. 1071-1075.

* cited by examiner

DOMAIN B   DOMAIN A   DOMAIN B   DOMAIN A   DOMAIN B

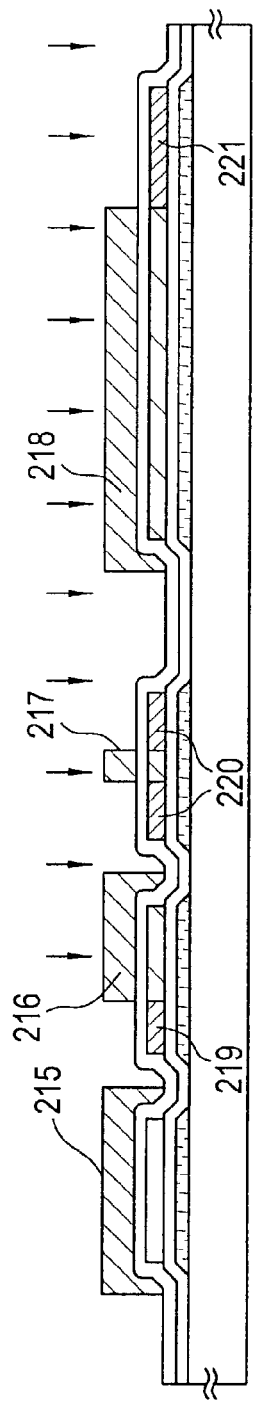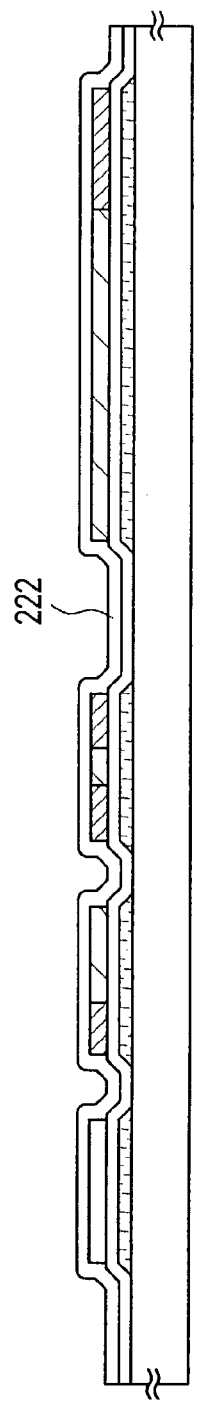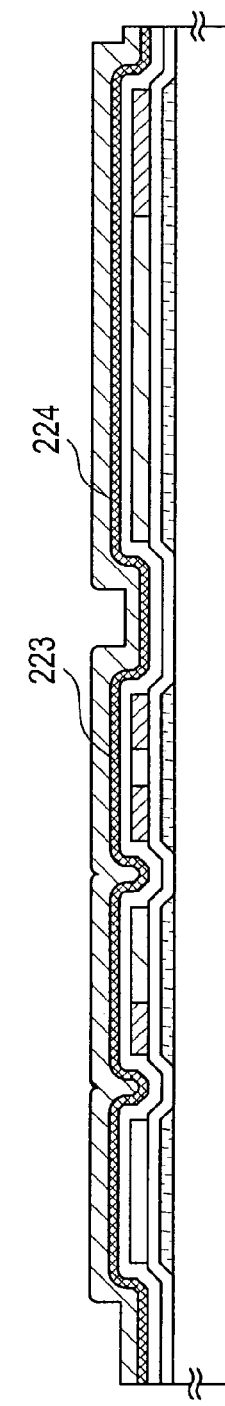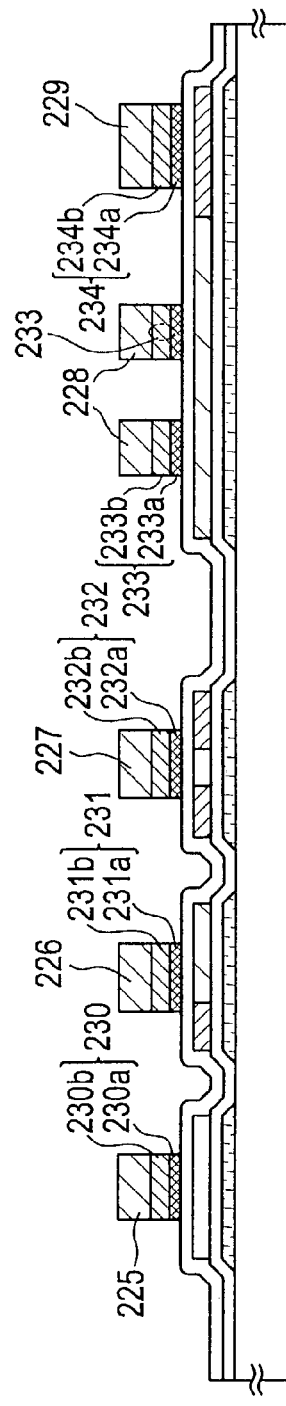

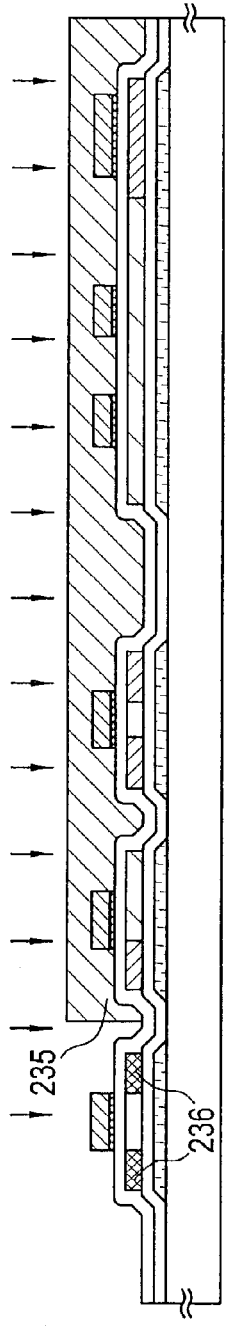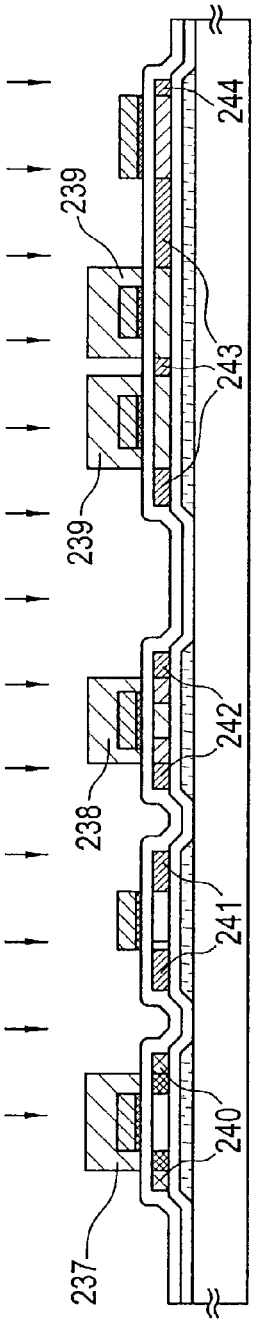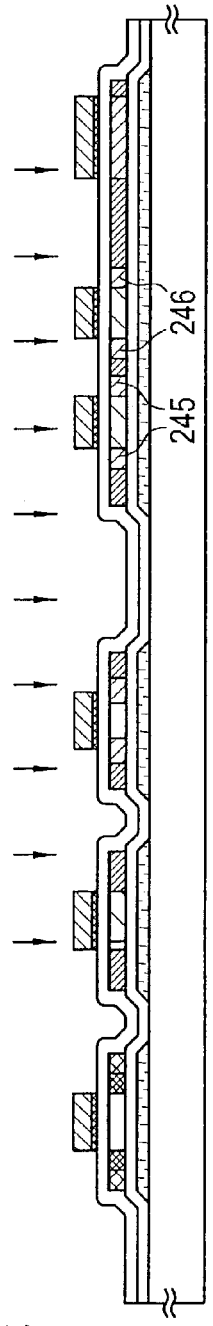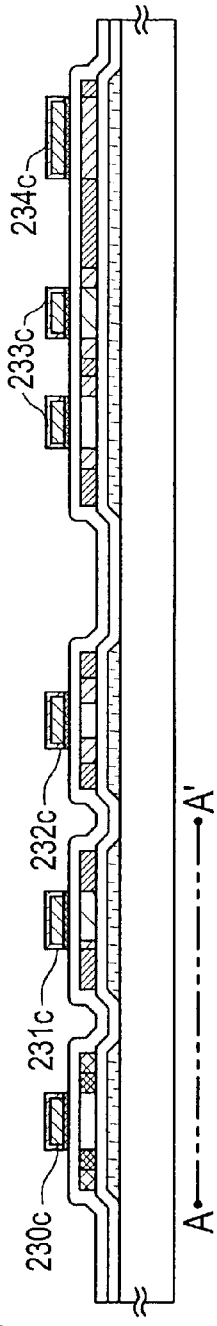
FIG. 11A
FIG. 11B
FIG. 11C
FIG. 11D

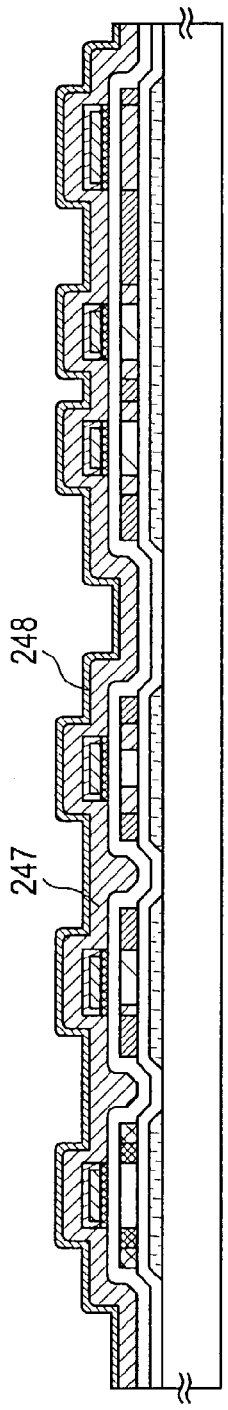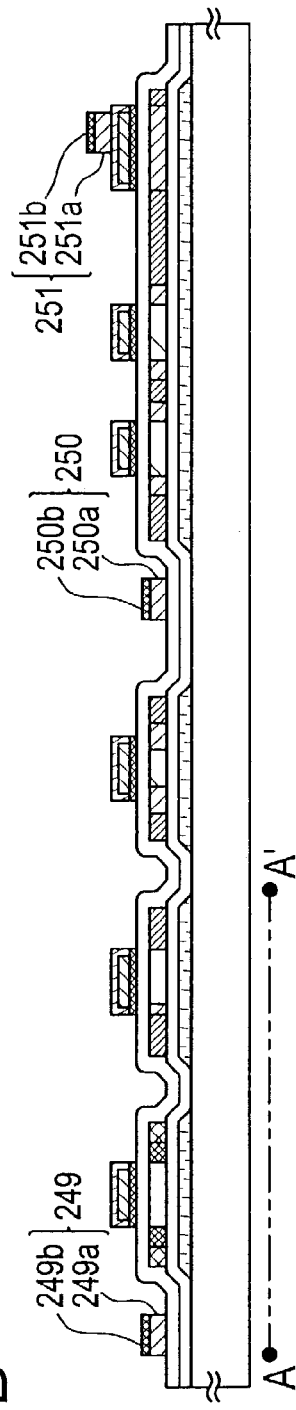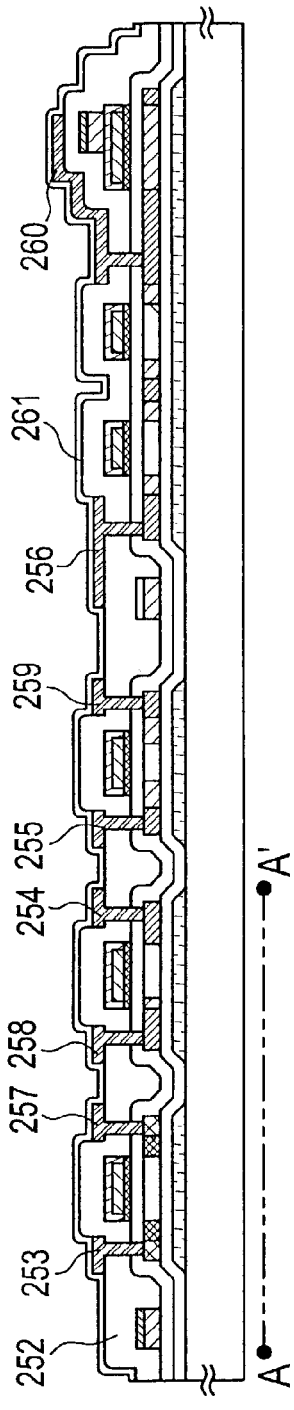

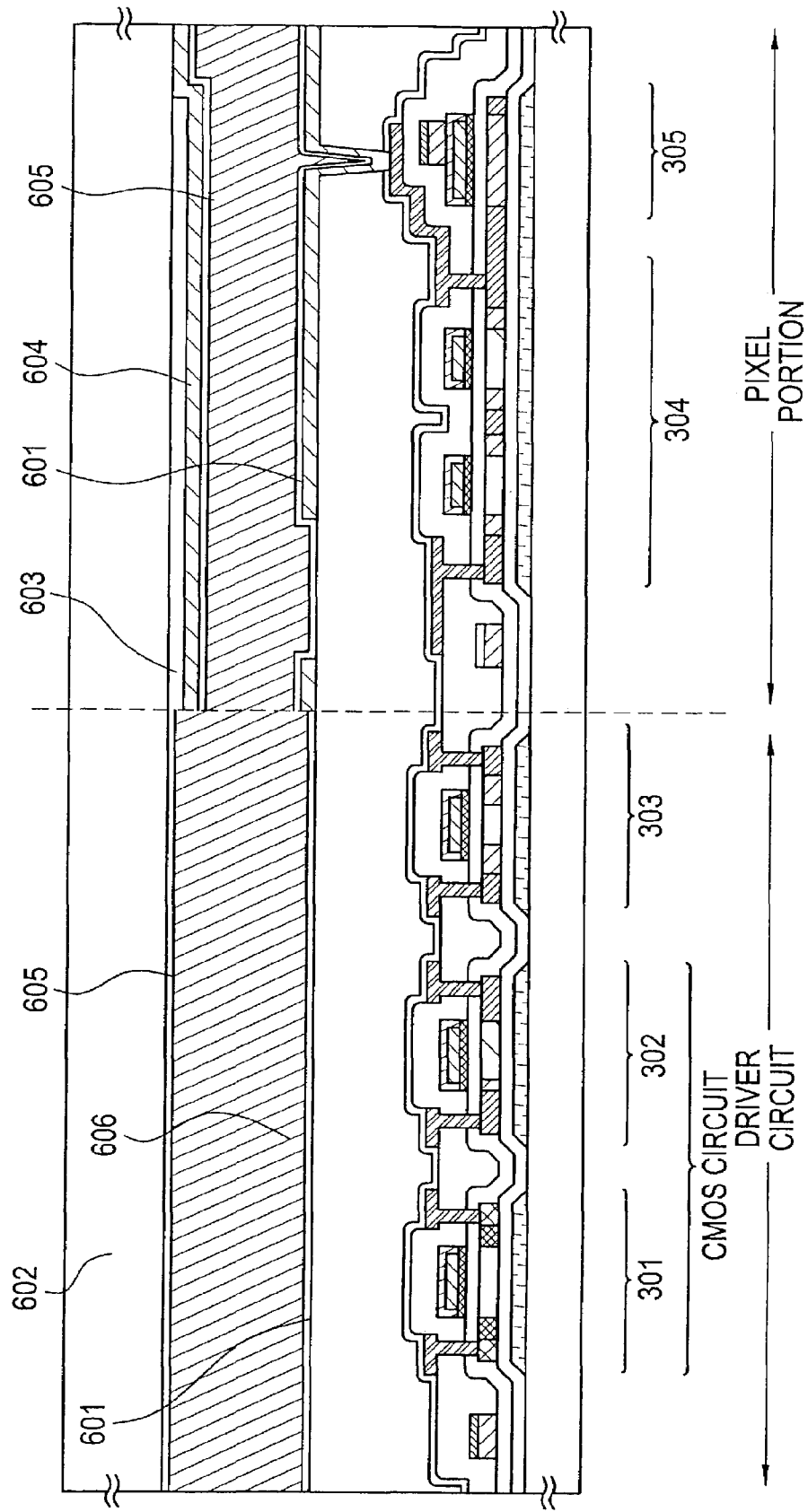

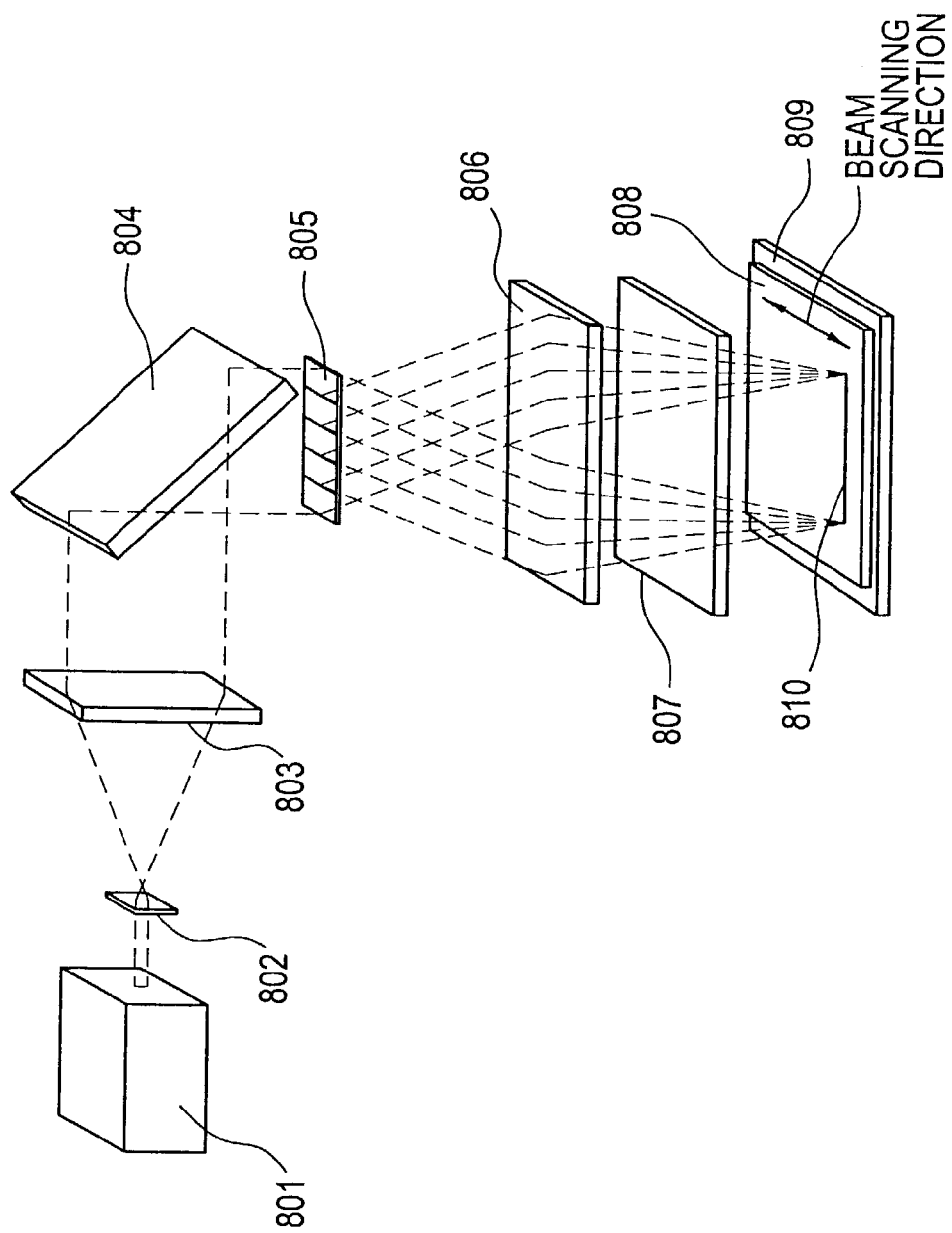

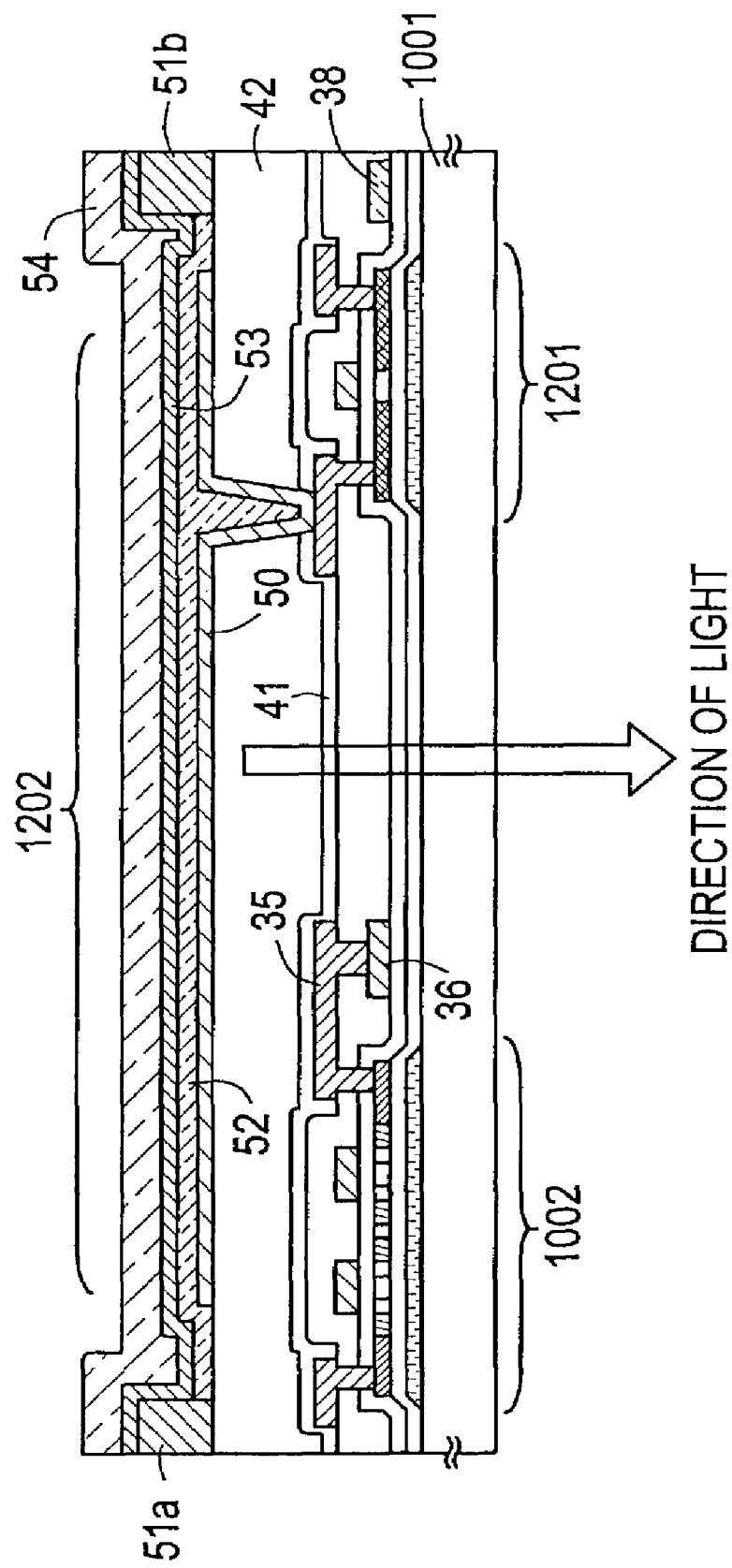

SEMICONDUCTOR DEVICE, AND METHOD OF FABRICATING THE SAME

BACKGROUND OF THE INVENTION

1. Field of the Invention

The present invention relates to a semiconductor device having a circuit which is configured of thin film transistors (hereinbelow, abbreviated to "TFTs"), and a method of fabricating the semiconductor device. By way of example, it relates to an electrooptic device which is typified by a liquid crystal display panel, and an electronic equipment in which such an electrooptic device is installed as a component.

Incidentally, here in this specification, the expression "semiconductor device" is intended to signify general devices which can function by utilizing semiconductor properties, and it shall cover all of electrooptic devices, semiconductor circuits and electronic equipment.

2. Description of the Related Art

There has been developed a thin film transistor (hereinbelow, abbreviated to "TFT") which employs as its active layer a crystalline semiconductor film prepared in such a way that an amorphous semiconductor film is formed on an insulating substrate having a light transmissivity, such as of glass, and then crystallized by laser annealing, thermal annealing or the like. A glass substrate of barium borosilicate glass, aluminoborosilicate glass or the like is often employed as the insulating substrate. Although such a glass substrate is inferior to a quartz substrate in the point of a heat resistance, it is inexpensive on the market, and hence, it has the merit of being capable of the easy manufacture of a large area substrate.

The laser annealing is known as a crystallizing technique which can crystallize the amorphous semiconductor film by bestowing high energy on only this film without considerably raising the temperature of the glass substrate. In particular, an excimer laser which produces a large power in a range of short wavelengths is considered most suited for this use. The laser annealing with the excimer laser is carried out in such a way that a laser beam is worked by an optical system so as to define a spot or a line on a surface to-be-irradiated, and that the surface to-be-irradiated is scanned by the worked laser beam (i.e., that the projected position of the laser beam is moved relatively to the surface to-be-irradiated). The excimer laser annealing with, for example, the rectilinear laser beam is also capable of laser-annealing the whole surface to-be-irradiated by the scanning in only a direction orthogonal to the longitudinal direction of the surface, and it is excellent in productivity. It is therefore becoming the mainstream as the manufacturing technology of a liquid crystal display device employing TFTs.

The laser annealing is applicable to the crystallization of various semiconductor materials. So far, however, a high field-effect mobility has been realized by employing a crystalline silicon film for the active layer of each TFT. The technology has incarnated a liquid crystal display device of monolithic type wherein pixel TFTs constituting pixel units, and the TFTs of driver circuits to be disposed around the pixel units are formed on a single glass substrate.

However, the crystalline silicon film prepared by the laser annealing has been formed in the shape of the aggregate of a plurality of crystal grains, and the locations and sizes of the crystal grains have been random. It has accordingly been impossible to form the crystalline silicon film with the locations and sizes of the crystal grains designated. The interfaces of the crystal grains (grain boundaries) have involved causes for degrading the current transport characteristics of carriers under the influences of recombination centers and trapping centers ascribable to amorphous structures, crystal defects etc., and potential levels at the grain boundaries. Nevertheless, it has been next to impossible that a channel forming region, in which the property of a crystal affects the characteristics of the TFT seriously, is formed of a single crystal grain with the influences of the crystal grains excluded. Until today, therefore, the TFT which employs the crystalline silicon film as its active layer has not attained characteristics comparable to those of a MOS transistor which is fabricated on a single-crystal silicon substrate.

As a method for solving such a problem, it is considered an effective expedient to enlarge the crystal grains and to control the locations of the large crystal grains, thereby to eliminate the crystal grain boundaries from the channel forming region. By way of example, "Location Control of Large Grain Following Excimer-Laser Melting of Si Thin-Films", R. Ishihara and A. Burtsev, Japanese Journal of Applied Physics, vol. 37, No. 3B, pp. 1071-1075, 1988, discloses a method which realizes the location control of crystals and the enlargement of grains by controlling the temperature distribution of a silicon film in three dimensions. According to the method, a film of refractory metal is formed on a glass substrate, the metal film is overlaid with a silicon oxide film which partially differs in thickness, and an amorphous silicon film is formed on the surface of the silicon oxide film. It has been reported that crystal grain diameters can be enlarged to several [μm] by irradiating both the surfaces of the resulting substrate with excimer laser beams.

The Ishihara et al. method features that the thermal characteristics of the subbing material of the amorphous silicon film are locally changed to control the flow of heat into the substrate and to afford a temperature gradient. To that end, however, the three-layer structure of the refractory metal layer/silicon oxide layer/semiconductor film is formed on the glass substrate. It is structurally possible to fabricate a TFT of top gate type by employing the semiconductor film as an active layer. Since, however, a parasitic capacitance is incurred by the silicon oxide film interposed between the semiconductor film and the refractory metal layer, the power dissipation of the TFT increases, and the high speed operation thereof is difficult of attainment.

On the other hand, the Ishihara et al. method is considered to be effectively applicable to a TFT of bottom gate type or inverse stagger type by employing the refractory metal layer as a gate electrode. In the three-layer structure, however, even when the thickness of the semiconductor film is excluded, the total thickness of the refractory metal layer and the silicon oxide layer is problematic. More specifically, since a thickness suitable for the crystallizing process does not always agree with a thickness suitable for the characteristics of the TFT element, both the optimum design of the structure for the crystallizing process and the optimum design thereof for the element characteristics cannot be satisfied simultaneously.

Besides, when the refractory metal layer having no light transmissivity is formed on the whole surface of the glass substrate, a liquid crystal display device of transmission type cannot be fabricated. The refractory metal layer is useful in the point of a high thermal conductivity. Since, however, a chromium (Cr) film or titanium (Ti) film used as the refractory metal material exhibits a high internal stress, a problem will occur as to the close adhesion of the metal film with the glass substrate at a high possibility. Further, the internal stress may possibly exert influence even on the semiconductor film overlying the metal film and act as a force distorting the crystalline semiconductor film formed.

Meanwhile, for the purpose of controlling into a predetermined range a threshold voltage (hereinbelow, denoted as "Vth") which is an important characteristic parameter for the TFT, it has been required besides the control of the valence electrons of the channel forming region, to lower the charged defect densities of the subbing film and a gate insulating film which are respectively formed of insulating films in close touch with the active layer, and to consider the balance between the internal stresses of both the films. A material containing silicon as a constituent element, such as the silicon oxide film or an oxidized silicon nitride film, has been suitable for such requirements. Accordingly, the formation of the refractory metal layer for affording the temperature gradient is apprehended to collapse the aforementioned balance.

SUMMARY OF THE INVENTION

The invention consists in techniques for solving the problems as stated above, and it has for its object to prepare a crystalline semiconductor film in which the locations and sizes of crystal grains have been controlled, and to realize a TFT capable of high speed operation by employing the crystalline semiconductor film as the channel forming region of the TFT. A further object of the present invention is to provide techniques by which such TFTs can be applied to various semiconductor devices of transmission type including a liquid crystal display device, an EL display device, etc.

The construction of the present invention resides in a semiconductor device characterized by comprising:

an organic resin film which is in a predetermined shape, and which lies in touch with a substrate having a light transmissivity;

an inorganic insulating film which covers said organic resin film; and a crystalline semiconductor film which lies in touch with said inorganic insulating film;

wherein said crystalline semiconductor film exists over said organic resin film through said inorganic insulating film.

Said inorganic insulating film is either a single-layer film which is selected from the group consisting of a silicon oxide film, a silicon nitride film and an oxidized silicon nitride film, or a multilayer film which consists of at least two of the single-layer films. Here, the thickness of said inorganic insulating film is set at 50 nm-200 nm.

Besides, the semiconductor device may well comprise a subbing insulating film which is formed between the substrate and said organic resin film.

In addition, the semiconductor device is characterized in that said organic resin film is either a single-layer film which is made of a material selected from the group consisting of a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, or a multilayer film which consists of at least two of the single-layer films. The thermal conductivity of said organic resin film is at most $1.0\,Wm^{-1}K^{-1}$.

Further, when said organic resin film has a photosensitivity, it can be easily patterned favorably.

Meanwhile, the construction of the present invention for realizing the above structures resides in a method of fabricating a semiconductor device, characterized by comprising the steps of:

forming an organic resin film in touch with a substrate which has a light transmissivity, and thereafter patterning the organic resin film into a predetermined shape;

forming an inorganic insulating film which covers said organic resin film having the predetermined shape;

forming an amorphous semiconductor film in touch with the inorganic insulating film; and irradiating the amorphous semiconductor film with a laser beam, thereby to form a crystalline semiconductor film which includes a first region, and a second region where crystal grain diameters are different from ones in the first region.

Besides, the crystal grain diameters in said first region are larger than those in the second region.

Incidentally, said first region is that region of the crystalline semiconductor film which is underlaid with said organic resin film through said inorganic insulating film. On the other hand, the second region is that region of the crystalline semiconductor film which is not underlaid with said organic resin film through said inorganic insulating film.

When said first region is employed as a channel forming region of a TFT, the TFT having excellent TFT characteristics can be obtained.

The construction of the invention resides also in a method of fabricating a semiconductor device, characterized by comprising the steps of:

forming an organic resin film in touch with a substrate which has a light transmissivity;

forming an inorganic insulating film which covers the organic resin film;

forming an amorphous semiconductor film in touch with the inorganic insulating film; and crystallizing the amorphous semiconductor film by irradiation with a laser beam, thereby to form a crystalline semiconductor film.

In each of the methods of fabrication, said inorganic insulating film and said amorphous semiconductor film may well be successively formed without touching the atmospheric air.

Also, in each of the methods of fabrication, the laser beam may well be projected from a front side of the substrate, or the laser beams may well be projected simultaneously from the front side and a back side of the substrate.

BRIEF DESCRIPTION OF THE DRAWINGS

FIGS. 10(A) through 10(D) are sectional views showing the fabricating process for the active matrix substrate;

FIGS. 11(A) through 11(D) are sectional views showing the fabricating process for the active matrix substrate;

FIGS. 12(A) through 12(C) are sectional views showing the fabricating process for the active matrix substrate;

FIG. 15 is a sectional structural view of an active matrix type liquid crystal display device (AM-LCD);

FIG. 18 is an arrangement diagram showing the construction of a laser annealing apparatus;

FIG. 22 is a sectional view showing still another example of construction of an EL display device;

DETAILED DESCRIPTION OF THE INVENTION

The invention will now be described in detail.

As a cause for small crystal grain diameters in the formation of a poly-silicon film based on prior-art laser crystallization, the inventors have considered that the cooling rate of a silicon layer after the melting thereof will be high to heighten the creation density of nuclei and to hamper sufficient crystal growth from one crystal nucleus. They have therefore thought out that the formation of crystals of large grain diameters will be possible when the cooling rate of the silicon layer after the melting thereof is lowered by suppressing the diffusion of heat from the silicon layer of an upper layer to a silicon oxide layer and a substrate of lower layers in case of the change of the molten silicon layer into a solid phase state.

Figure 1:
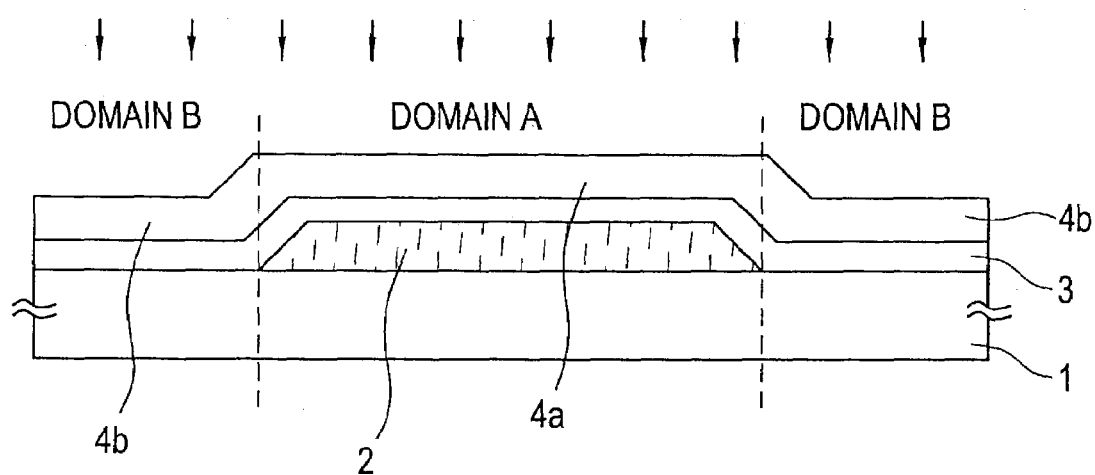
FIG. 1 is a sectional view for explaining the construction of the invention.

The invention features that crystallization based on laser annealing is carried out after the establishment of a state as shown in FIG. 1 where an organic resin film 2 is formed on a selected part of a substrate 1 having an insulating surface, an inorganic insulating film 3 containing silicon is formed in touch with the organic resin film 2, and an amorphous semiconductor film is formed on the resulting substrate structure.

With the laser annealing, the semiconductor film is heated and molten by optimizing the conditions of laser light (or a laser beam) for irradiation, so as to control the creation density of crystal nuclei and crystal growth from the crystal nuclei.

In FIG. 1, a domain A demarcated by broken lines is a domain in which the organic resin film 2 is held between the substrate 1 and the inorganic insulating film 3, and that part of the semiconductor film which lies in the domain A shall be called the "first region 4a". On the other hand, each of domains B is a domain in which the organic resin film 2 is not held between the substrate 1 and the inorganic insulating film 3, and that part of the semiconductor film which lies in the domain B shall be called the "second region 4b".

FIG. 18 is an arrangement diagram showing an example of the construction of a laser annealing apparatus. An excimer laser, an argon laser, a YAG laser or the like is applied to a laser beam generator 801. Second harmonics may well be employed in the case of the YAG laser. A laser beam emergent from the laser beam generator 801 is expanded in one direction by beam expanders 802 and 803. The laser beam reflected by a mirror 804 is split by a cylindrical lens array 805, and the resulting beam is turned into a rectilinear beam having a line width of 100 μm-1000 μm, by cylindrical lenses 806 and 807. The rectilinear beam irradiates the surface of a sample so as to define an irradiated area 810. A substrate 808 is held on a stage 809 which is movable in an X-direction, a Y-direction and a Θ-direction. Herein, the laser annealing can be performed over the whole surface of the substrate 808 by moving the stage 809 relatively to the irradiated area 810. On this occasion, the crystallization may be done by holding the substrate 808 either in the atmospheric air, or under a lowered pressure or in an inert gas atmosphere.

By the way, with the laser annealing, particularly when the excimer laser emitting a laser beam at wavelengths of, at most, 400 nm is used as a light source, the semiconductor film can be preferentially heated, and hence, the use of the excimer laser is appropriate. The pulse width of the excimer laser is several nsec—several tens nsec, for example, 30 nsec. Therefore, when the frequency of pulsed lasing is set at 30 Hz for the irradiation, the semiconductor film is heated by the pulsed laser beam for an instant, and it is cooled for a time period which is much longer than the heating time. Immediately after the irradiation with the laser beam has ended, heat begins to diffuse through the inorganic insulating film 3, so that the semiconductor film in the domains B abruptly begins to be cooled and is turned into a solid phase state. In contrast, in the domain A, the heat diffusion from the semiconductor film into the substrate 1 is suppressed by the existence of the organic resin film 2, so that the cooling rate of the semiconductor film becomes lower than in the domains B.

The crystal nuclei are conjectured to be created and formed in a cooling process in which a molten state is shifted into the solid phase state. The creation density of the nuclei correlates with the temperature and cooling rate of the molten state. In this regard, it has been obtained as empirical knowledge that, when the semiconductor film is quenched from the high temperature, the nucleus creation density tends to heighten. Accordingly, in each of the second regions 4b (the semiconductor film lying in the domains B) which are abruptly cooled from the molten state, the creation density of the crystal nuclei becomes higher than in the first region 4a (the semiconductor film lying in the domain A), and the crystal nuclei are created at random. Consequently, a plurality of crystal grains are formed, and the grain diameters thereof become small relatively to those of crystal grains created in the first region 4a. On the other hand, in the first region 4a, it is permitted to control the temperature and cooling rate of the molten state by optimizing the conditions of the irradiating laser light and the organic resin film 2 as well as the inorganic insulating film 3. It is accordingly possible to suppress the number of creation of the crystal nuclei and to grow crystals of large grain diameters.

By the way, a glass substrate of barium borosilicate glass or aluminoborosilicate glass, a quartz substrate or the like can be employed as the substrate 1 having the insulating surface. The glass substrate should desirably be employed in view of the point of having a light transmissivity, the point of being inexpensive, and the point of being capable of the easy manufacture of a large area substrate.

Such organic resin films 2 are formed in the shape of islands or stripes distributively on the substrate 1 while essentially conforming to the arrangement of the active layers (the semiconductor films in each of which a channel forming region, a source region, a drain region and an LDD region are formed) of TFTs. The size of the organic resin layer 2 may be set at a submicron size of 0.35×0.35 $\mu m^2$ (channel length× channel width) in conformity with, for example, the size of the TFT, or it can be set at 8×8 $\mu m^2$, 8×200 $\mu m^2$, 12×400 $\mu m^2$ or so. The organic resin film 2 is formed conforming to, at least, the position and size of the channel forming region of the TFT, whereby the channel forming region can be formed of a crystalline semiconductor film of large crystal grain diameter lying over the organic resin film 2.

Besides, the organic resin film 2 is not especially restricted as long as its thermal conductivity is equal to or lower than 1.0 $Wm^{-1}K^{-1}$, preferably 0.3 $Wm^{-1}K^{-1}$. Since this thermal conductivity of the organic resin film 2 is much lower as compared with those of the substrate 1 (quartz glass: 1.4 $Wm^{-1}K^{-1}$) and the inorganic insulating film 3 (1 $Wm^{-1}K^{-1}$-2 $Wm^{-1}K^{-1}$) containing silicon and lying on the organic resin film 2 in touch, the heat diffusion from the semiconductor film into the substrate 1 is sufficiently suppressed.

Mentioned as the material of the organic resin film 2 is, for example, a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB, or polysilazane. Among all, the BCB (benzocyclobutene) resin whose refractoriness is as high as about 450° C. and which has a plasma immunity as well as a flattening property is the most favorable for the invention.

In addition, since the inorganic insulating film 3 and the amorphous semiconductor film are stacked on the organic resin film 2, this organic resin film should desirably be formed by spin coating which flattens the surface thereof, and the end parts of the organic resin film 2 patterned should desirably be formed into a tapered shape so as to attain good coverage. Besides, when the organic resin film 2 is formed by employing a coating method typified by the spin coating, advantageously it is much lower in cost than an inorganic insulating film formed by a CVD equipment, and it does not require a complicated process for the film formation. Further, as regards the patterning of the organic resin film 2, when a photosensitive organic resin film is employed as the film 2, photolithography with a photoresist is not required, and hence, the number of fabricating steps can be decreased. Still further, even in a case where the photosensitive organic resin film is not employed, advantageously the etching rate of the film 2 relative to the substrate 1 or a subbing insulating film is secured more easily than in the etching of the inorganic insulating film formed by CVD, and the controllability of the film 2 is higher than that of the inorganic insulating film.

The thickness of the organic resin film 2 should desirably be set at 100 nm-500 nm. The cooling rate at a crystallizing step can be controlled by regulating the thickness. By the way, in a case where the thickness is less than 100 nm, the flatness of the film 2 worsens. On the other hand, in a case where the thickness is greater than 500 nm, the level difference of the film 2 is excessively large, and the formation of the films to-be-stacked becomes difficult.

Properly usable as the inorganic insulating film 3 containing silicon is a single-layer film which is selected from the group consisting of a silicon oxide film, a silicon nitride film and an oxidized silicon nitride film formed by PCVD, LPCVD or sputtering, or a multilayer film which consists of at least two of the above films. The inorganic insulating film 3 fulfills the function of preventing impurities from diffusing from the substrate 1 and the organic resin film 2 into the semiconductor film to-be-stacked, and the function of enhancing the close adhesion of the semiconductor film. Besides, the substrate structure in which the organic resin film 2 is made of the BCB resin (450° C.) and is covered with the silicon oxide film 3 can endure a heat treatment at about 550° C. In this manner, the inorganic insulating film 3 serves to protect the organic resin film 2 and is also effective to enhance the refractoriness of the organic resin film 2.

The thickness of the inorganic insulating film 3 containing silicon is set at 50 nm-200 nm. When the thickness of the inorganic insulating film 3 is greater than 200 nm, the heat diffusion from the semiconductor film into the substrate 1 may possibly fail to be suppressed. On the other hand, when the thickness of the inorganic insulating film 3 is less than 50 nm, the coverage worsens and might fail to conceal the organic resin film 2.

The amorphous semiconductor film which is formed on the inorganic insulating film 3 containing silicon, may be any of various amorphous semiconductor films and microcrystal semiconductor films and may well be a compound semiconductor film having an amorphous structure, such as amorphous silicon germanium film. Besides, a method of forming the amorphous semiconductor film may be any known method such as PCVD, LPCVD or sputtering.

According to the invention, crystal grain diameters can be controlled by regulating the cooling rate on the basis of the material and thickness of the inorganic insulating film 3 or those of the organic resin film 2. Moreover, the location of crystals of large grain diameters can be controlled by the allocation of the organic resin film 2.

The fabrication of crystalline semiconductor films in the shape of islands will be briefly described as an example of a fabricating method according to the present invention, with reference to FIGS. 2(A) through 2(D).

Figure 2A:
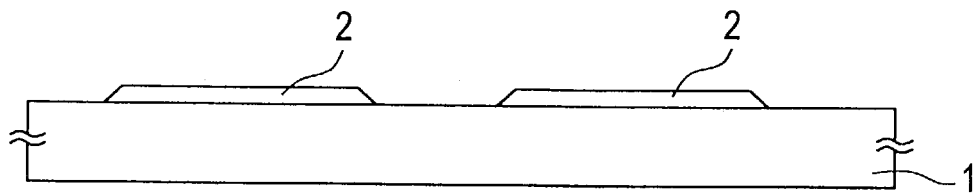
FIGS. 2(A) through 2(D) are sectional views showing a fabricating process for crystalline semiconductor films according to the invention.
Figure 2B:
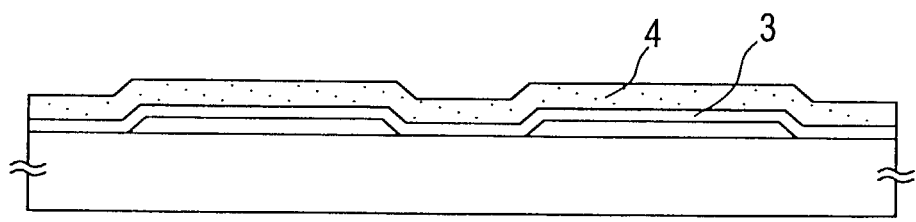

First, an organic resin film is formed on a substrate 1 which is a non-alkaline glass substrate or the like, and it is patterned into organic resin films 2 in a desired shape (in the shape of islands or stripes) (FIG. 2(A)).

Next, an inorganic insulating film 3 covering the organic resin films 2 is formed. Subsequently, an amorphous semiconductor film 4 is formed on the inorganic insulating film 3 (FIG. 2(B)). Here, the inorganic insulating film 3 and the amorphous semiconductor film 4 may well be successively formed without touching the atmospheric air, thereby to alleviate the mixing of impurities.

Figure 2C:
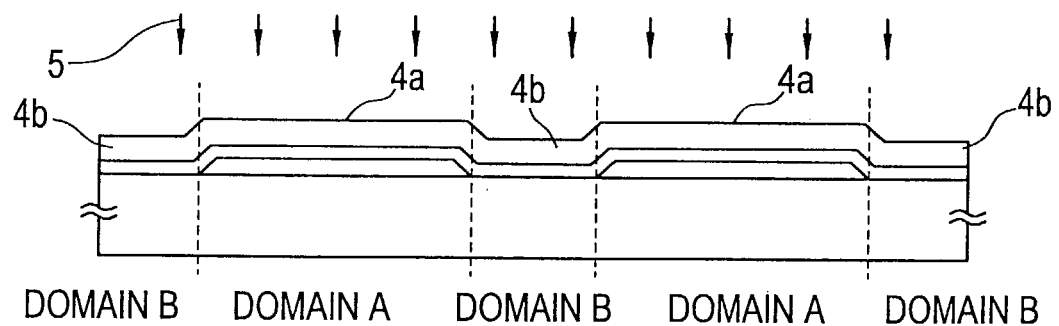

At the next step, the amorphous semiconductor film 4 is crystallized by irradiation with a laser beam 5, thereby to form crystalline semiconductor films 4a and 4b (FIG. 2(C)).

Figure 2D:
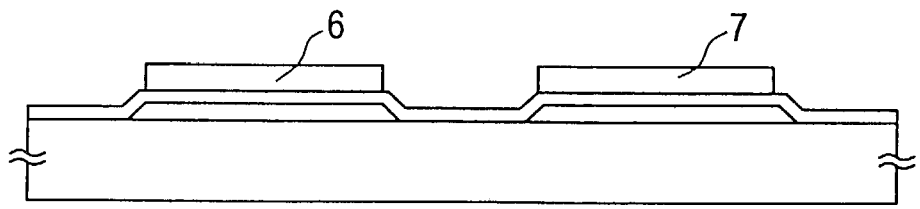

Subsequently, the crystalline semiconductor films 4a, 4b are patterned to finish up the island-like crystalline semiconductor films 6 and 7 each of which is made of the first region 4a (FIG. 2(D)).

Thereafter, TFTs are fabricated in accordance with a known method by employing the island-like crystalline semiconductor films 6 and 7 formed by the steps shown in FIGS. 2(A) through 2(D), as the active layers (the semiconductor films in each of which a channel forming region, a source region, a drain region and an LDD region are formed) of the TFTs. Then, a semiconductor device having excellent electric characteristics is obtained.

Figure 3A:
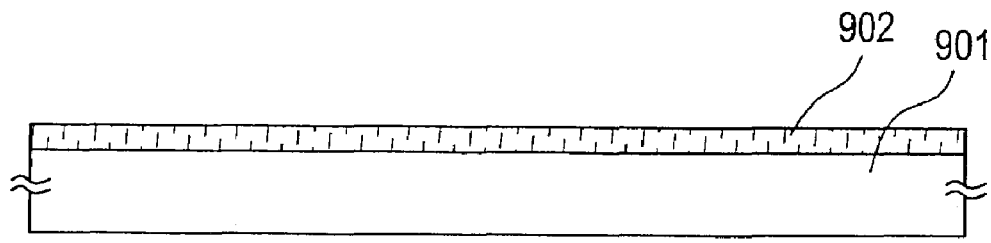
FIGS. 3(A) through 3(D) are sectional views showing a fabricating process for crystalline semiconductor films according to the invention.
Figure 3B:
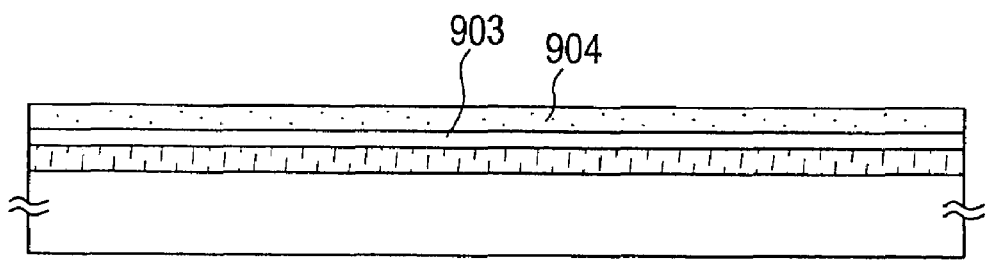
Figure 3C:
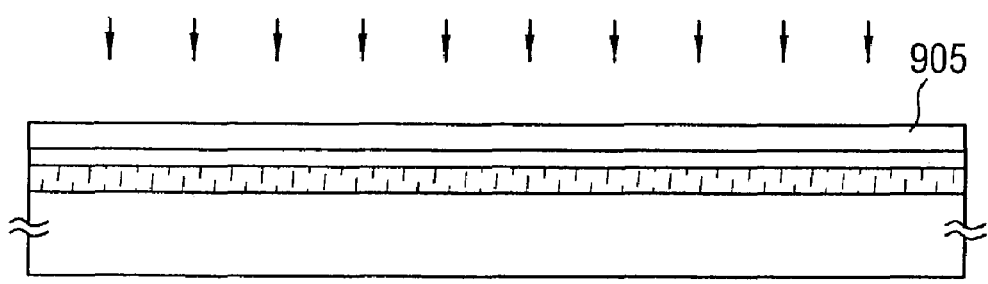

Alternatively, as shown in FIG. 3(C), laser crystallization may well be carried out after the establishment of a state where an organic resin film 902 is formed entirely on a substrate 901 having an insulating surface, where an inorganic insulating film 903 containing silicon is provided in touch with the organic resin film 902 and where the inorganic insulating film 903 is overlaid with an amorphous semiconductor film 904. In this case, a cooling rate at the laser crystallization can be regulated in accordance with the material and thickness of the organic resin film 902, but the control of the locations of crystals having large grain diameters is difficult. By the way, in an example, the cooling rate at the crystallization became lower than in case of laser-crystallizing an amorphous semiconductor film formed on a plastics substrate, but it could not be regulated.

Figure 4:
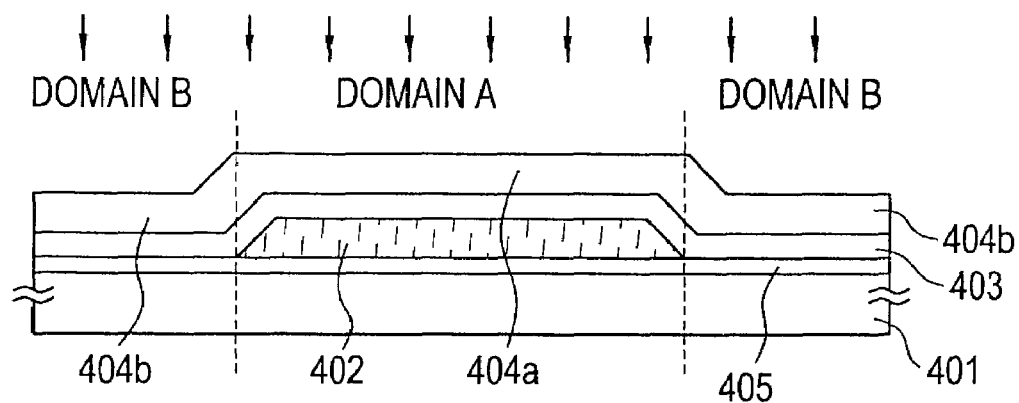
FIG. 4 is a sectional view for explaining an example of construction according to the invention.

Also, a subbing insulating film 405 may well be provided as shown in FIG. 4. The subbing insulating film 405 can prevent impurity diffusion from a substrate 401, and can enhance the close adhesion between the substrate 401 and an organic resin film 402.

Incidentally, the "cooling rate" in this specification shall signify the cooling rate of the semiconductor film after the melting thereof by the laser beam.

Figure 5:
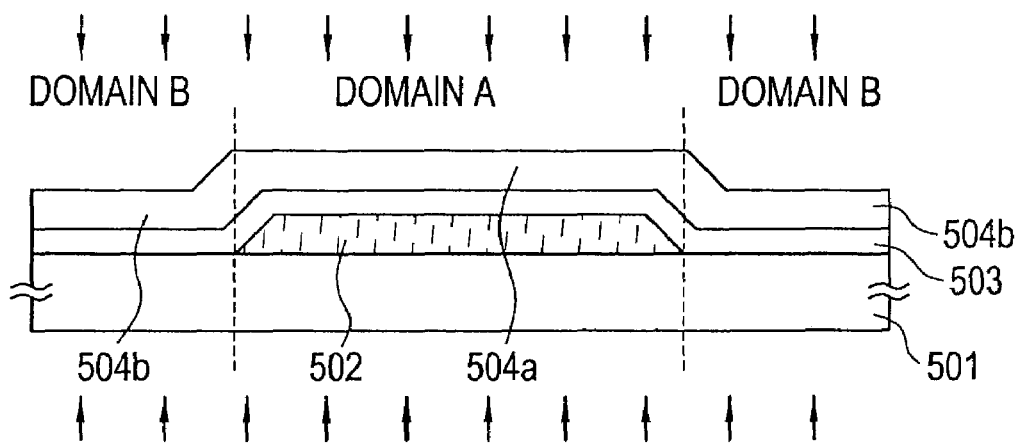
FIG. 5 is a sectional view for explaining another example of construction according to the invention.

Besides, only conventional laser annealing is not applied to the crystallizing step, but laser beams may well be projected simultaneously from the front side and back side of a substrate 501 as shown in FIG. 5. In addition, a pulsed lasing type or a continuous emission type may well be employed for the laser beam. Also, the laser beam can be defined by an optical system into a rectilinear beam, a spot-like beam, a planar beam, etc., and the shape thereof is not restricted.

Further, the laser annealing may well be implemented while a substrate is being heated. Also, thermal annealing and the laser annealing may well be combined. Alternatively, a crystallizing method which employs a catalytic element may well be applied.

The present invention constructed as stated above will be described in more detail in conjunction with embodiments below.

Embodiment 1

There will be described steps for preparing crystalline semiconductor films (crystalline silicon films in this embodiment) which have been patterned in the shape of islands by utilizing the invention. Reference will be had to FIGS. 2(A)-2(D) below.

First, a starting organic resin film (100 nm-500 nm thick) is formed on a substrate 1 having a light transmissivity, by spin coating or the like and subsequent baking. In an example, as the organic resin film, a benzocyclobutene film (hereinbelow, called "BCB film") was applied by the spin coating and was thereafter baked (at 300° C. for one hour), thereby to attain a thickness of 200 nm. Incidentally, the thickness of the BCB film employed in this embodiment can have its thickness readily controlled in accordance with a spin frequency. Needless to say, in a case where the crystalline semiconductor films are not to be applied to a transmission type display device (such as a liquid crystal panel), the substrate 1 having the light transmissivity need not be transparent, and the organic resin film is not restricted to the BCB film as long as it has a refractoriness and a plasma immunity enough to endure a later process which uses a CVD equipment.

Subsequently, the BCB film is patterned by known photolithography, and organic resin films 2 in the shape of islands are formed by dry etching (FIG. 2(A)). In the example, the dry etching was performed by employing a mixed gas which consisted of $O_2$ and $CF_4$. The positions of the island-like organic resin films 2 are set in conformity with those of the island-like crystalline silicon films which are to be formed later. Besides, when a material having a photosensitivity is employed for the starting organic resin film, this film can be patterned without using a resist, and hence, the fabricating process can be shortened.

Subsequently, an inorganic insulating film 3 having a thickness of 50 nm-200 nm is formed by a known method so as to cover the island-like organic resin films 2. Usable as the inorganic insulating film 3 is a single-layer film which is selected from the group consisting of a silicon oxide film, a silicon nitride film and an oxidized silicon nitride film formed by a known method such as PCVD, LPCVD or sputtering, or a multilayer film which consists of at least two of the above films. Here, in the case of employing the silicon nitride film or the oxidized silicon nitride film, the balance of internal stresses needs to be considered. The inorganic insulating film 3 is formed for the purpose of preventing impurities from diffusing from the substrate 1, the purpose of enhancing the close adhesion of a semiconductor film which is to be formed later, and the purpose of securing a selection ratio relative to the semiconductor film which is to be etched later. In the example, a silicon oxide film having a thickness of 50 nm was formed by the PCVD.

Next, the amorphous semiconductor film 4 is formed on the inorganic insulating film 3. In the example, an amorphous silicon film having a thickness of 55 nm was formed by the PCVD (FIG. 2(B)). Insofar as the semiconductor film 4 includes an amorphous structure, it is not restricted to the amorphous silicon film. It may well be, for example, a microcrystal semiconductor film or a compound semiconductor film having the amorphous structure, such as amorphous silicon germanium film. Further, the inorganic insulating film 3 and the amorphous semiconductor film 4 may well be successively formed without touching the atmospheric air.

At the next step, the amorphous semiconductor film 4 is crystallized by laser annealing. A rectilinear beam having a width of 100 μm-1000 μm is employed as a laser beam 5, and it is projected from the front side of the substrate 1 as shown in FIG. 2(C). In the example, a laser irradiation apparatus whose light source was an excimer laser of pulsed lasing type was used (FIG. 2(C)).

When irradiated with the pulsed laser beam 5 at the crystallizing step with this laser beam, the amorphous silicon film 4 is instantly heated to fall into a molten state. Thereafter, in each of domains A, the silicon film in the molten state is gradually cooled in such a manner that heat is conducted from the lower surface of the molten silicon film to the organic resin film 2 and the substrate 1 through the inorganic insulating film 3 in succession.

On the other hand, in each of domains B, the silicon film in the molten state is abruptly cooled in such a manner that heat is conducted from the lower surface of the molten silicon film to the substrate 1 through the inorganic insulating film 3 in succession.

Accordingly, in the domain B where the organic resin film 2 does not exist, silicon is abruptly cooled after the laser irradiation, and hence, crystal grain diameters become small. In contrast, in the domain A where the organic resin film 2 exists, silicon is gradually cooled, so that a crystallizing rate becomes low enough to form a polycrystal silicon film (polysilicon film) in which crystal grain diameters are large. Since the thermal conductivity of the organic resin film 2 is much lower than that of the inorganic insulating film 3, the cooling rate after the laser irradiation is suppressed. This cooling rate can be controlled in accordance with the material and thickness of the organic resin film 2.

Subsequently, the crystalline semiconductor film after the crystallization is patterned by known photolithography, thereby to form the island-like crystalline semiconductor films 6 and 7 (FIG. 2(D)). In the example, the patterning was implemented by dry etching with a mixed gas which consisted of $O_2$ and $CF_4$.

In the above way, the cooling rate after the laser irradiation was controlled in accordance with the island-like organic resin films 2, whereby the island-like crystalline silicon films 6 and 7 of very low lattice defect density and large crystal grain diameters could be formed at the desired positions. In case of employing the island-like crystalline silicon films 6 and 7 as the active layers of TFTs, excellent characteristics can be attained.

Embodiment 2

While the instance in which the starting organic resin film is patterned has been mentioned in Embodiment 1, an instance in which an organic resin film is not patterned will be described with reference to FIGS. 3(A)-3(D) in Embodiment 2.

First, in the same way as in Embodiment 1, the starting organic resin film 902 (100 nm-500 nm thick) is formed on a substrate 901 having a light transmissivity, by spin coating or the like and subsequent baking. In an example, as the organic resin film 902, a BCB film was applied by the spin coating and was thereafter baked (at 300° C. for one hour), thereby to attain a thickness of 200 nm (FIG. 3(A)). Incidentally, the thickness of the BCB film employed in this embodiment can have its thickness readily controlled in accordance with a spin frequency. Needless to say, in a case where crystalline semiconductor films are not to be applied to a transmission type display device (such as a liquid crystal panel), the substrate 901 having the light transmissivity need not be transparent, and the organic resin film 902 is not restricted to the BCB film as long as it has a refractoriness and a plasma immunity enough to endure a later process which uses a CVD equipment.

Subsequently, an inorganic insulating film 903 having a thickness of 50 nm-200 nm is formed by a known method so as to cover the organic resin film 902. Usable as the inorganic insulating film 903 is a single-layer film which is selected from the group consisting of a silicon oxide film, a silicon nitride film and an oxidized silicon nitride film formed by a known method such as PCVD, LPCVD or sputtering, or a multilayer film which consists of at least two of the above films. The inorganic insulating film 903 is formed for the purpose of preventing impurities from diffusing from the substrate 901, the purpose of enhancing the close adhesion of a semiconductor film which is to be formed later, and the purpose of securing a selection ratio relative to the semiconductor film which is to be etched later. In the example, a silicon oxide film having a thickness of 50 nm was formed by the PCVD.

Next, the amorphous semiconductor film 904 is formed on the inorganic insulating film 903. In the example, an amorphous silicon film 903 having a thickness of 55 nm was formed by the PCVD (FIG. 3(B)). Insofar as the semiconductor film 904 includes an amorphous structure, it is not restricted to the amorphous silicon film. It may well be, for example, a microcrystal semiconductor film or a compound semiconductor film having the amorphous structure, such as amorphous silicon germanium film. Further, the inorganic insulating film 903 and the amorphous semiconductor film 904 may well be successively formed without touching the atmospheric air.

At the next step, the amorphous semiconductor film 904 is crystallized by laser annealing. A rectilinear beam having a width of 100 µm-1000 µm is employed as a laser beam, and it is projected from the front side of the substrate 901 as shown in FIG. 3(C). In the example, a laser irradiation apparatus whose light source was an excimer laser of pulsed lasing type was used (FIG. 3(C)).

When irradiated with the pulsed laser beam at the crystallizing step with this laser beam, the amorphous silicon film 904 is instantly heated to fall into a molten state. Thereafter, the silicon film in the molten state is gradually cooled in such a manner that heat is conducted from the lower surface of the molten silicon film to the organic resin film 902 and the substrate 901 through the inorganic insulating film 903 in succession. In this embodiment, the BCB film being the organic resin film 902 exists on the whole surface of the substrate 901, so that a crystallizing rate becomes low enough to uniformly form a polycrystal silicon film (poly-silicon film) 905 in which crystal grain diameters are large. Since the thermal conductivity of the organic resin film 902 is much lower than that of the inorganic insulating film 903, the cooling rate after the laser irradiation is suppressed. This cooling rate can be controlled in accordance with the material and thickness of the organic resin film 902.

Figure 3D:
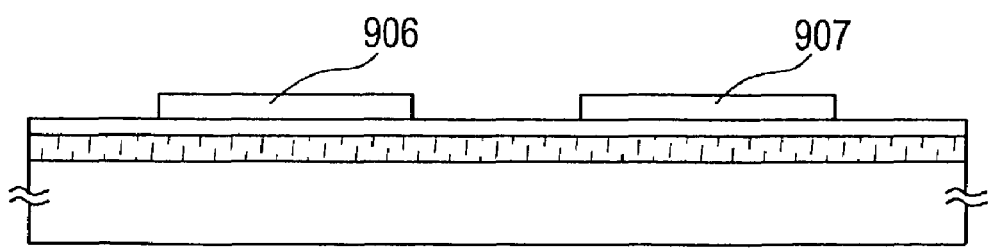

Subsequently, the crystalline semiconductor film 905 after the crystallization is patterned by known photolithography, thereby to form the island-like crystalline semiconductor films 906 and 907 (FIG. 3(D)). In the example, the patterning was implemented by dry etching with a mixed gas which consisted of $O_2$ and $CF_4$.

In the above way, the cooling rate after the laser irradiation was controlled in accordance with the organic resin film 902, whereby the island-like crystalline silicon films 906 and 907 of very low lattice defect density and large crystal grain diameters could be formed. In case of employing the island-like crystalline silicon films 906 and 907 as the active layers of TFTs, excellent characteristics can be attained.

Embodiment 3

In this embodiment, an instance in which a subbing insulating film is provided between a substrate and an organic resin film will be described with reference to FIG. 4.

First, the subbing insulating film 405 having a thickness of 50 nm-400 nm is formed on the glass substrate 401 by a known method. Usable as the subbing insulating film 405 is a single-layer film which is selected from the group consisting of a silicon oxide film, a silicon nitride film and an oxidized silicon nitride film formed by a known method such as PCVD, LPCVD or sputtering, or a multilayer film which consists of at least two of the above films. Here, in the case of employing the silicon nitride film or the oxidized silicon nitride film, the balance of internal stresses needs to be considered. The subbing insulating film 405 is formed for the purpose of preventing impurities from diffusing from the substrate 401. In an example, a silicon oxide film having a thickness of 50 nm was formed by the PCVD.

Subsequently, a starting organic resin film (100 nm-500 nm thick) is formed on the subbing insulating film 405, by spin coating or the like and subsequent baking. In the example, as the organic resin film, a benzocyclobutene film (hereinbelow, called "BCB film") was applied by the spin coating and was thereafter baked (at 300° C. for one hour), thereby to attain a thickness of 200 nm. Needless to say, in a case where a crystalline semiconductor film is not to be applied to a transmission type display device (such as a liquid crystal panel), the substrate 401 having a light transmissivity need not be transparent, and the organic resin film is not restricted to the BCB film as long as it has a refractoriness and a plasma immunity enough to endure a later process which uses a CVD equipment.

At the next step, the BCB film is patterned by known photolithography in conformity with Embodiment 1, and the island-like organic resin film 402 is formed by dry etching. Here, the subbing insulating film 405 protects the surface of the glass substrate 401 from the dry etching.

Subsequent steps conform to Embodiment 1. More specifically, an inorganic insulating film 403 and an amorphous semiconductor film are formed by known methods so as to cover the island-like organic resin film 402. Thereafter, laser crystallization is implemented, and a cooling rate after laser irradiation is controlled, whereby the crystalline silicon film 404a of very low lattice defect density and large crystal grain diameters is formed at a desired position (in a domain A). Incidentally, crystal grain diameters in a crystalline semiconductor film 404b lying in each of domains B are small. In case of employing the crystalline semiconductor film 404a as the active layer of a TFT, excellent characteristics can be attained.

Besides, this embodiment can be combined with Embodiment 2 on occasion.

Embodiment 4

In this embodiment, an instance in which crystallization is done by a laser irradiation method different from that of Embodiment 1 will be described with reference to FIG. 5. By the way, since this embodiment is the same as Embodiment 1 except the laser irradiation method, detailed description shall be omitted.

An island-like organic resin film 502 is formed on a substrate 501 in conformity with Embodiment 1. Subsequently, in the same way as in Embodiment 1, an inorganic insulating film 503 covering the island-like organic resin film 502 is formed, and an amorphous semiconductor film is formed on the inorganic insulating film 503. In this embodiment, however, the substrate 501 and the island-like organic resin film 502 need to have light transmissivities.

Next, as shown in FIG. 5, laser beams are simultaneously projected from the front side and back side of the substrate 501. Here, when the ratio between the energy of the laser beam for irradiating the substrate 501 from the front side thereof and the energy of the laser beam for irradiating the substrate 501 from the back side thereof is 6:4-8:2, favorably crystal grain diameters in a polycrystal semiconductor film can be enlarged still more.

Owing to the above steps, a cooling rate after the laser irradiation is controlled, whereby the crystalline silicon film 504a of very low lattice defect density and large crystal grain diameters is formed at a desired position (in a domain A). Incidentally, crystal grain diameters in a crystalline semiconductor film 504b lying in each of domains B are as small as 0.3 μm or less. In case of employing the crystalline semiconductor film 504a as the active layer of a TFT, excellent characteristics can be attained.

Besides, this embodiment can be optionally combined with Embodiment 2 or Embodiment 3 on occasion.

Embodiment 5

In this embodiment, a process for fabricating a CMOS circuit which consists of an n-channel TFT and a p-channel TFT will be described with reference to FIGS. 6(A)-6(E), FIGS. 7(A)-7(E) and FIGS. 8(A)-8(C).

First, island-like organic resin films 103 and 104, an inorganic insulating film 105, and island-like semiconductor films 107 and 108a are formed on a substrate 101 by the method stated in Embodiment 1. Subsequently, a mask layer 109 which is made of a silicon oxide film having a thickness of 50 nm-100 nm is formed by plasma CVD, lowered-pressure CVD or sputtering (FIG. 6(A)).

Figure 6A:
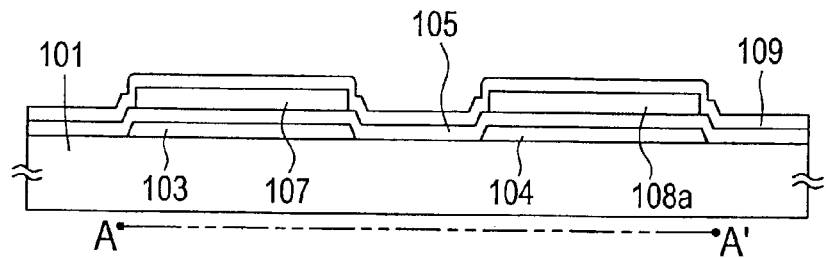
FIGS. 6(A) through 6(E) are sectional views showing a fabricating process for TFTs.
Figure 8A:
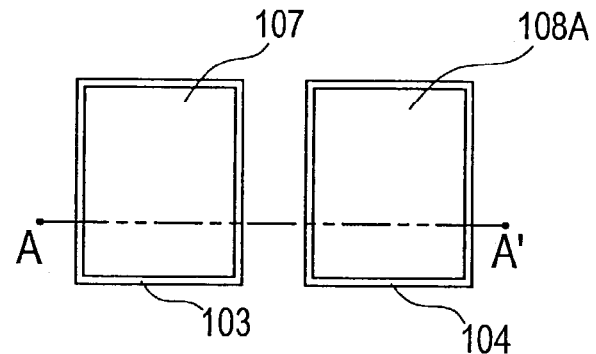
FIGS. 8(A) through 8(C) are top plan views showing the fabricating process for the TFTs.

FIG. 8(A) illustrates a top plan view of a part in FIG. 6(A). The island-like semiconductor films 107 and 108b are provided so as to overlie the organic resin films 103, 104 patterned and formed in the shape of islands, respectively. In FIG. 8(A), section A-A' corresponds to the sectional structure shown in FIG. 6(A).

Figure 6B:
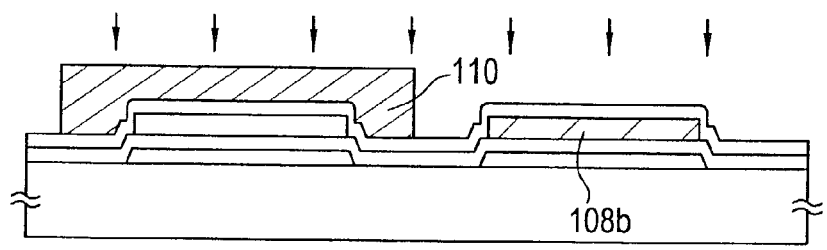

Subsequently, as shown in FIG. 6(B), a photoresist mask 110 is provided, and the island-like semiconductor film 108a for forming the n-channel TFT is doped with an impurity element for bestowing the p-conductivity type, at a concentration of about $1 \times 10^{16}$ atoms/cm$^3$-$5 \times 10^{17}$ atoms/cm$^3$ in order to control the threshold voltage of the TFT. The elements of group-13 of the periodic table, such as boron (B), aluminum (Al) and gallium (Ga), are known as the impurity elements which bestow the p-type on semiconductors. Here in an example, diborane ($B_2H_6$) was used to dope the island-like semiconductor film 108a with boron (B) by ion doping. The doping with boron (B) is not always necessary, but it may well be omitted. A semiconductor layer 108b doped with boron (B), however, can be formed for the purpose of confining the threshold voltage of the n-channel TFT within a predetermined range.

In order to form the LDD region of the n-channel TFT, the island-like semiconductor film 108b is selectively doped with an impurity element for bestowing the n-conductivity type. The elements of group-15 of the periodic table, such as phosphorus (P), arsenic (As) and antimony (Sb), are known as the impurity elements which bestow the n-type on semiconductors. A photoresist mask 111 is formed for the doping. Here in the example, ion doping which employed phosphine ($PH_3$) was applied in order to selectively dope the island-like semiconductor film 108b with phosphorus (P). The concentration of phosphorus (P) in an impurity region 112 to be formed is set within a range of $2 \times 10^{16}$ atoms/cm$^3$-$5 \times 10^{19}$ atoms/cm$^3$ (FIG. 6(C)). Here in this specification, the concentration of the impurity element for bestowing the n-type, contained in the impurity region 112, shall be expressed as (n$^-$).

Figure 6C:
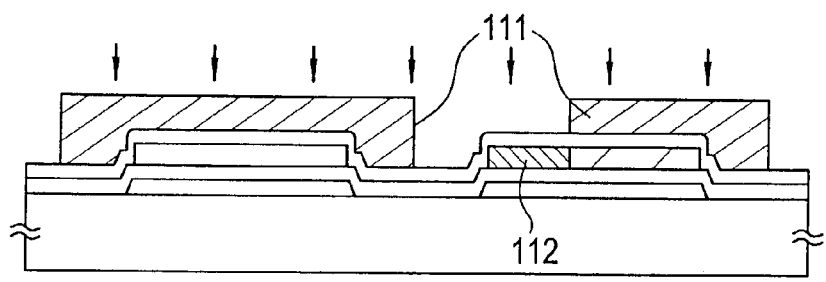
Figure 6D:
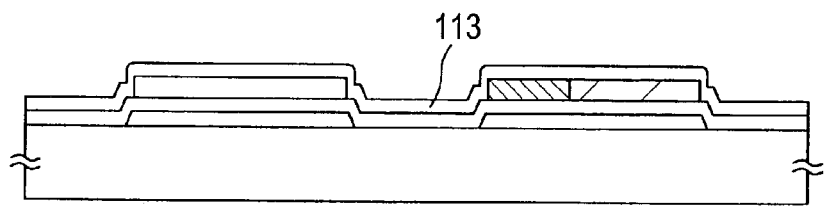

Subsequently, the mask layer 109 is removed using an etchant, such as hydrofluoric acid diluted with pure water, in the actual example. In addition, the step of activating the impurity elements introduced into the island-like semiconductor film 108b at the steps of FIGS. 6(B) and 6(C) is carried out. The activation can be done by an expedient such as laser annealing, or thermal annealing at 500-600° C. for 1-4 hours in a nitrogen atmosphere. Alternatively, both the expedients may be used conjointly. In the example, the expedient of the laser activation was employed. More specifically, the emergent beam of an excimer laser was defined into a rectilinear beam, and the whole surface of the substrate structure formed with the island-like semiconductor films 107, 108b was irradiated with the rectilinear beam under the conditions of a lasing frequency of 5 Hz-50 Hz, an energy density of 100 mJ/cm$^2$-500 mJ/cm$^2$ and a scanning-beam overlap proportion of 80%-98%. Incidentally, the conditions for the irradiation with the laser beam are not especially restricted, but they may be properly determined by a person in charge.

A gate insulating film 113 is formed of an insulating film containing silicon, at a thickness of 40 nm-150 nm by employing plasma CVD or sputtering. By way of example, an oxidized silicon nitride film may be formed at a thickness of 120 nm. Besides, an oxidized silicon nitride film prepared from $SiH_4$ and $N_2O$ with $O_2$ added thereto is still better for the reason that the density of fixed charges in the film is lower. The gate insulating film 113 is not restricted to such an oxidized silicon nitride film, but it may well be formed of another insulating film containing silicon as a single layer or a multilayer structure (FIG. 6(D)).

Figure 6E:
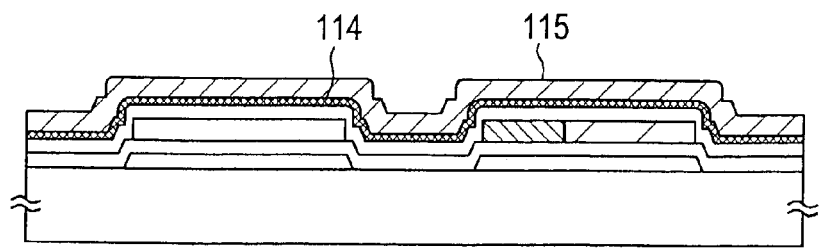

As shown in FIG. 6(E), an electrically conductive film is deposited on the gate insulating film 113 in order to form a gate electrode. The conductive layer may well be formed of a single layer, but it can be formed as a multilayer structure consisting of two layers or three layers, at need. In the example, there were stacked a conductive layer (A) 114 made of a metal nitride film being electrically conductive, and a conductive layer (B) 115 made of a metal film. The conductive layer (B) 115 may be formed of an element which is selected from among tantalum (Ta), titanium (Ti), molybdenum (Mo) and tungsten (W), an alloy whose principal component is the above element, or an alloy film in which the above elements are combined (typically, an Mo—W alloy film or an Mo—Ta alloy film). On the other hand, the conductive layer (A) 114 is formed of tantalum nitride (TaN), tungsten nitride (WN), titanium nitride (TiN), molybdenum nitride (MoN) or the like. Alternatively, tungsten silicide, titanium silicide or molybdenum silicide may well be applied to the conductive layer (A) 114.

The conductive layer (A) 114 may be set at a thickness of 10 nm-50 nm (preferably, 20 nm-30 nm), and the conductive layer (B) 115 at a thickness of 200 nm-400 nm (preferably, 250 nm-350 nm). In the example, a WN film being 30 nm thick and a W film being 350 nm were respectively employed for the conductive layer (A) 114 and the conductive layer (B) 115, and both the films were formed by sputtering. Incidentally, although no illustration is made, it is effective that a silicon film doped with phosphorus (P) is previously formed to a thickness of about 2 nm-20 nm under the conductive film (A) 114. Thus, the close adhesion of the conductive film to be formed on the silicon film can be enhanced, and the oxidation thereof can be prevented. Simultaneously, an alkali metal element which the conductive layer (A) 114 or the conductive layer (B) 115 contains in a slight amount can be prevented from diffusing into the gate insulating film 113. Anyway, the conductive layer (B) 115 should preferably have its resistivity set within a range of 10 μΩcm-500 μΩcm.

Subsequently, a photoresist mask of predetermined pattern is formed, and the conductive layer (A) 114 and the conductive layer (B) 115 are collectively etched, thereby to form gate electrodes 116 and 117. The gate electrode 116 (117) is such that a layer 116a (117a) originating from the conductive layer (A), and a layer 116b (117b) originating from the conductive layer (B) are unitarily stacked. On this occasion, the gate electrode 117 for the n-channel TFT is formed so as to overlap the impurity region 112 through the gate insulating film 113 (FIG. 7(A)). Incidentally, each gate electrode can also be formed only of the conductive layer (B).

Figure 7A:
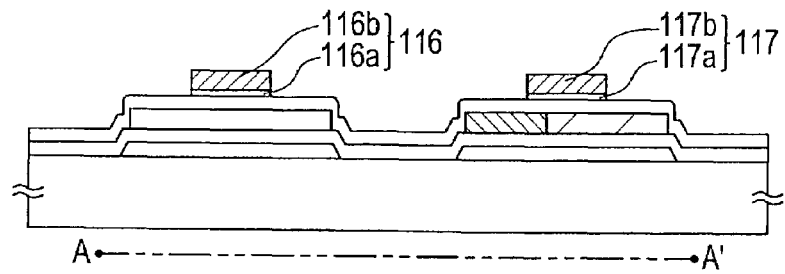
FIGS. 7(A) through 7(E) are sectional views showing the fabricating process for the TFTs.
Figure 7B:
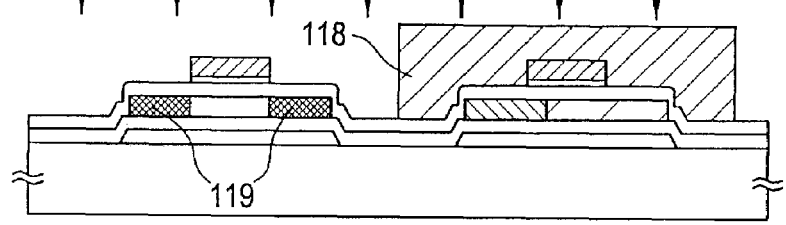
Figure 7C:
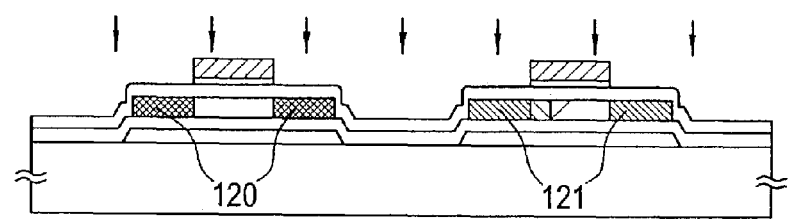
Figure 7D:
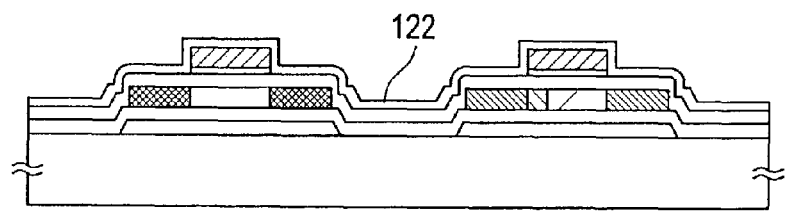
Figure 8B:
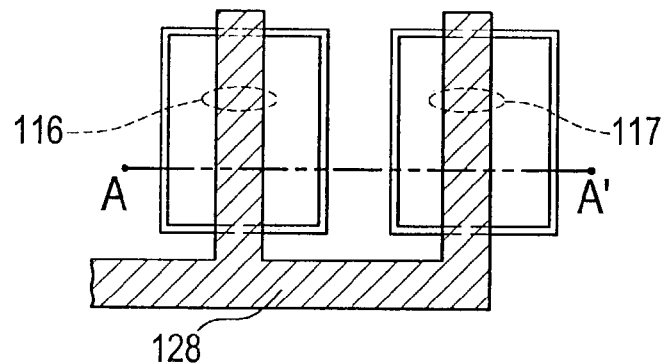

FIG. 8(B) illustrates a top plan view of a part in FIG. 7(A). The gate electrodes 116 and 117 which are respectively provided over the island-like semiconductor films 107 and 108b through the gate insulating film 113, are connected to a gate wiring line 128. In FIG. 8(B), section A-A' corresponds to the sectional structure shown in FIG. 7(A).

Subsequently, impurity regions 119 to serve as a source region and a drain region are formed in the island-like semiconductor film 107 for forming the p-channel TFT. Herein, an impurity element bestowing the p-type is introduced using the gate electrode 116 as a mask, thereby to form the impurity regions 119 in self-alignment fashion. On this occasion, the island-like semiconductor film 108b for forming the n-channel TFT is kept covered with a photoresist mask 118. Besides, the impurity regions 119 are formed by ion doping which employs diborane ($B_2H_6$). The concentration of boron (B) in the regions 119 is set at $3\times10^{20}$ atoms/cm$^3$-$3\times10^{21}$ atoms/cm$^3$ (FIG. 7(B)). By the way, in this specification, the concentration of the impurity element for bestowing the p-type, contained in the impurity regions 119 formed here, shall be expressed as (p$^+$).

Subsequently, impurity regions 121 to serve as a source region and a drain region are formed in the island-like semiconductor film 108b for forming the n-channel TFT. Here in the example, the impurity regions 121 were formed by ion doping with phosphine ($PH_3$), and the concentration of phosphorus (P) in the regions 121 was set at $1\times10^{20}$ atoms/cm$^3$-$1\times10^{21}$ atoms/cm$^3$ (FIG. 7(C)). By the way, in this specification, the concentration of the impurity element for bestowing the n-type, contained in the impurity regions 121 formed here, shall be expressed as (n$^+$). On this occasion, the impurity regions 119 are simultaneously doped with the element phosphorus (P). Since, however, the concentration of phosphorus (P) contained in impurity regions 119 is on the order of about ½-⅓ in comparison with the concentration of boron (B) already introduced at the preceding step, the p-type is ensured in impurity regions 120, and no influence is exerted on the characteristics of the p-channel TFT.

Thereafter, the step of activating the impurity elements bestowing the n-type and p-type and introduced at the respective concentrations is performed by thermal annealing. An annealing furnace may be employed for the activating step. Alternatively, laser annealing or rapid thermal annealing (RTA) can be employed. Herein the example, the method of laser activation was employed, the emergent beam of a KrF excimer laser (at a wavelength of 248 nm) was defined into a rectilinear beam, and the whole surface of the substrate structure formed with the island-like semiconductor films 107 and 108b was irradiated with the rectilinear beam under the conditions of a lasing frequency of 5 Hz-50 Hz and an energy density of 100 mJ/cm$^2$-500 mJ/cm$^2$. Besides, a protective insulating layer 122 which is 50 nm-200 nm thick may be formed of an oxidized silicon nitride film, a silicon nitride film or the like before the annealing treatment (FIG. 7(D)).

In the example, after the activating step, a heat treatment was further carried out at 300° C.-450° C. for one hour-12 hours in an atmosphere containing 3%-100% of hydrogen, thereby to hydrogenate the island-like semiconductor films 107 and 108b. The hydrogenating step is the step in which dangling bonds existing at a density of $10^{16}$/cm$^3$-$10^{18}$/cm$^3$ in the island-like semiconductor films 107 and 108b are terminated with hydrogen atoms excited thermally. Plasma hydrogenation (which employs hydrogen excited by a plasma) may well be performed as another expedient for the hydrogenation.

After the activating and hydrogenating steps have ended, an oxidized silicon nitride film or a silicon oxide film is further stacked on the protective insulating layer 122, thereby to form an inter-layer insulating layer 123. Likewise to the protective insulating layer 122, the oxidized silicon nitride film is formed to a thickness of 500 nm-1500 nm (preferably, 600 nm-800 nm) under the conditions of a reaction pressure of 160 [Pa], a substrate temperature of 325° C. and a discharge power density of 0.15 W/cm² by setting the flow rates of SiH$_4$ and N$_2$O at 27 SCCM and 900 SCCM, respectively. Besides, contact holes which reach the source regions and drain regions of the TFTs are formed in the inter-layer insulating layer 123 and the protective insulating layer 122, whereupon source wiring lines 124, 125 and drain wiring lines 126 are formed in the contact holes. Although no illustration is made, each of the electrodes in the example was made of a multilayer film of three-layer structure in which a Ti film being 100 nm thick, an Al film containing Ti and being 300 nm thick, and a Ti film being 150 nm thick were continuously formed by sputtering.

Subsequently, a silicon nitride film or an oxidized silicon nitride film is formed to a thickness of 50 nm-500 nm (typically, 100 nm-300 nm) as a passivation film 127. Further, when a hydrogenating process was performed in this state in the example, favorable results for enhancements in the characteristics of the TFTs were obtained. By way of example, a heat treatment may be carried out for the hydrogenating process, at 300° C.-450° C. for one hour-12 hours in an atmosphere containing 3%-100% of hydrogen. Even when plasma hydrogenation was alternatively employed, similar effects were attained. Also, the hydrogenation can be done in such a way that hydrogen existing in the inter-layer insulating film 123 and the protective insulating layer 122 is diffused into the island-like semiconductor films 107 and 108b by the heat treatment as stated above.

Figure 7E:
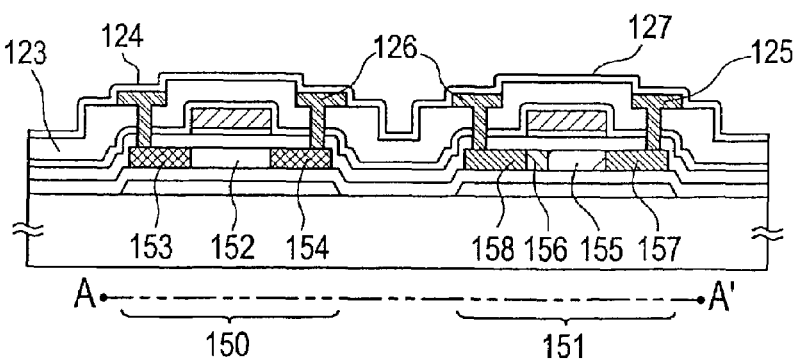

In this way, as shown in FIG. 7(E), the n-channel TFT 151 and the p-channel TFT 150 could be completed on the substrate 101. The p-channel TFT 150 includes the channel forming region 152, the source region 153 and the drain region 154 in the island-like semiconductor film 107. The n-channel TFT 151 includes the channel forming region 155, the LDD region 156 overlapped by the gate electrode 117 (hereinbelow, such an LDD region shall be denoted by symbol "Lov"), the source region 157 and the drain region 158 in the island-like semiconductor film 108b. In the example, the length of the region Lov in the channel length direction of the TFT was set at 0.5 μm-3.0 μm (preferably, 1.0 μm-1.5 μm) for a channel length of 3 μm-8 μm. Although each TFT was fabricated as a single-gate structure in the example, it may well have a double-gate structure or a multi-gate structure including at least three gate electrodes.

Figure 8C:
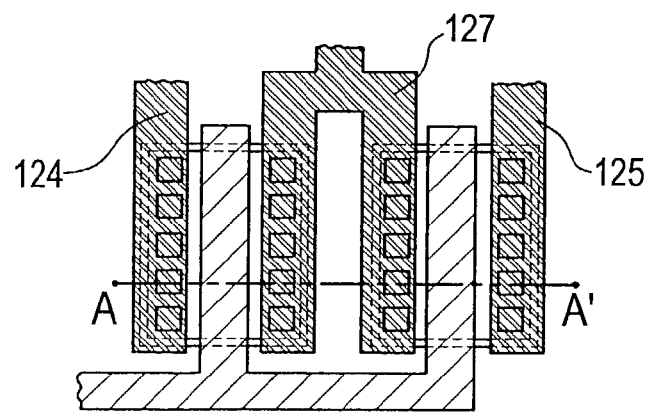

FIG. 8(C) illustrates a top plan view of a part in FIG. 7(E). The source wiring lines 124 and 125 are respectively held in touch with the island-like semiconductor films 107 and 108b by the contact holes, not shown, which are provided in the inter-layer insulating layer 123 as well as the protective insulating layer 122. In FIG. 8(C), section A-A' corresponds to the sectional structure shown in FIG. 7(E).

In each of the p-channel TFT 150 and n-channel TFT 151 thus fabricated, the channel forming region is formed of the polycrystal silicon film of large crystal grain diameters. Besides, such TFTs can be employed for constructing a shift register circuit, a buffer circuit, a D/A converter circuit, a level shifter circuit, a multiplexor circuit, etc. A semiconductor device which is fabricated on a glass substrate, such as a liquid crystal display device, an EL display device or a close touch type image sensor, can be constructed by properly combining the circuits as mentioned above.

In all the above heat treatments, sufficient care needs to be taken of the heat-treating temperatures so that they may lie within the withstand temperature range of the organic resin films 103 and 104.

Embodiment 6

Embodiments of the present invention is explained using FIGS. 9 to 13. Here, a detailed explanation is made of a method of manufacturing a pixel TFT of a pixel portion, and driver circuit TFTs formed in the periphery of the pixel portion on the same substrate. Note that, in order to simplify the explanation, a CMOS circuit, which is the basic circuit for control circuits such as a shift register circuit and a buffer circuit, and an n-channel TFT forming a sampling circuit are shown in the figures.

Figure 9A:
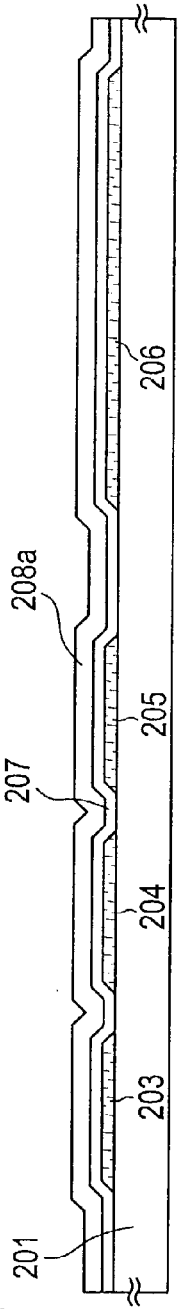
FIGS. 9(A) through 9(D) are sectional views showing a fabricating process for an active matrix substrate.
Figure 9B:
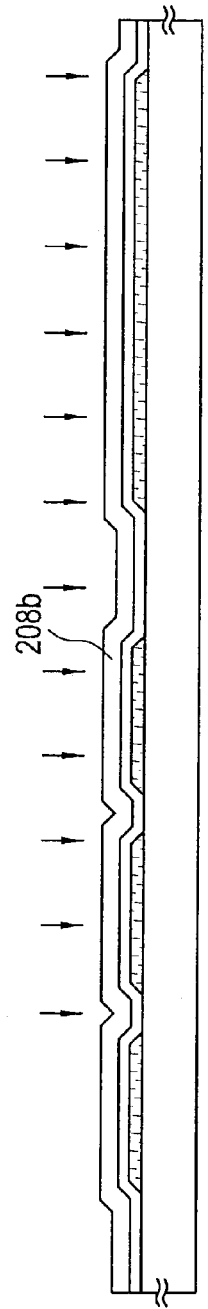

First, island-like organic resin films 203 to 206, an inorganic resin film 207 and a non-crystalline semiconductor film 208a are formed on the substrate 201 by the method explained in the embodiment 1. (FIG. 9A)

Next, by the method shown in embodiment 1, laser crystallization is performed to the non-crystalline semiconductor film 208a to form the crystalline semiconductor film 208b. (FIG. 9B) In the crystalline semiconductor film 208b, a diameter of crystal grain of the region, which have an organic resin film via inorganic resin film at the bottom, is bigger than the region thereof which have not an organic resin film.

Figure 9C:
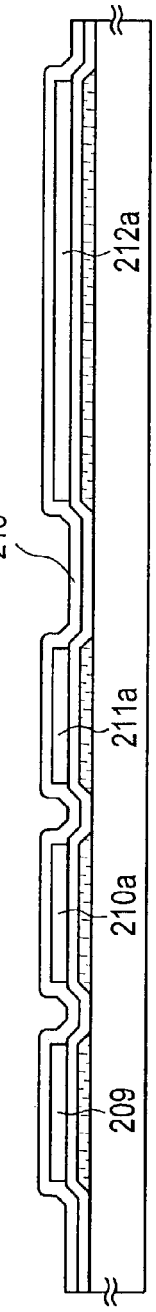

The crystalline silicon film 208b is then etched and divided into island-shapes, forming island-shape semiconductor layers 209 and 210a to 212a, which are made into active layers. A mask layer 213, which is made of silicon oxide film, is then formed by plasma CVD, reduced pressure CVD, or sputtering into a thickness of between 50 and 100 nm. (FIG. 9C)

Channel doping is then performed. A photoresist mask 214 is formed first, and boron (B) is added as an impurity element that imparts p-type conductivity to the entire surface of the island-shape semiconductor layers 210a to 212a, which form the n-channel type TFT, at a concentration about $1 \times 10^{16}$ to $5 \times 10^{17}$ atoms/cm³, with the aim of controlling the threshold voltage. Ion doping may be used for the addition of boron (B), and boron (B) can be added at the same time as the amorphous silicon film is formed. It is not always necessary to add boron (B) here, but it is preferable to form semiconductor layers 210b to 212b with added boron in order to place the threshold voltage of the n-channel TFT within a predetermined range. (FIG. 9D)

In order to form an LDD region of the n-channel TFT of the driver circuit, an impurity element that imparts n-type conductivity is selectively added to the island-shape semiconductor layers 210b and 211b. Photoresist masks 215 to 218 are formed beforehand. Phosphorous (P) must be added here, and ion doping using phosphine (PH$_3$) is applied. The phosphorous (P) concentrations of formed impurity regions (n⁻) 219 and 220 are set to between $1 \times 10^{17}$ and $5 \times 10^{19}$ atoms/cm³, respectively. Further, an impurity region 221 is a semiconductor layer for forming a storage capacitor in the pixel portion, and phosphorous (P) is added to this region at the same concentration.

Figure 9D:
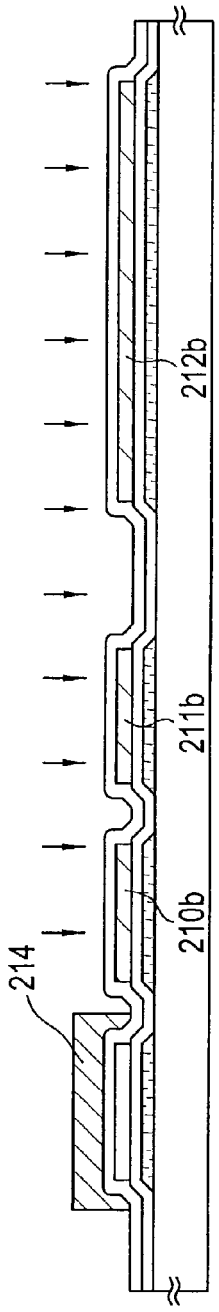

The mask layer 213 is removed next by a substance such as hydrofluoric acid, and a process of activating the impurity elements added by the steps of FIG. 9D and FIG. 10A is performed. The activation can be performed by thermal annealing for 1 to 4 hours at between 500 and 600° C., or by laser annealing. Further, both methods may be performed together. Laser activation is used in the present embodiment, and KrF excimer laser light (wavelength 248 nm) formed into a linear shape beam is used, with an oscillation frequency of 5 to 50 Hz and the energy density set to between 100 and 500 mJ/cm$^2$, and this is scanned with an overlap ratio for the linear shape beam of 80 to 98%, processing the entire surface of the substrate on which the island-shape semiconductor layers are formed. Note that there are no specific limitation placed on the laser light irradiation conditions, and that the operator may set them suitably.

A gate insulating film 222 is then formed to a thickness of between 40 and 150 nm from an insulating film containing silicon using plasma CVD or sputtering, for example, a silicon oxynitride film which is formed by SiH$_4$, N$_2$O and O$_2$ as its principal constituent by plasma CVD method is used.

A first conducting layer is formed next in order to form a gate electrode. A conducting layer (A) 223 made from a metallic nitride film having conductivity, and a conducting layer (B) 224 made from a metallic film are laminated in the present embodiment. The conducting film (B) 224 is formed by tungsten (W) to a thickness of 250 nm, and the conducting layer (A) 223 is formed from tungsten nitride (WN) to a thickness of 50 nm, by sputtering using W as a target. (FIG. 10C)

Photoresist masks 225 to 229 are formed next, and the conducting layer (A) 223 and the conducting layer (B) 224 are etched at the same time, forming gate electrodes 230 to 233 and a capacitor wiring 234. The gate electrodes 230 to 233 and the capacitor wiring 234 are formed, respectively, as a single body from conducting layers (A) 230a to 234a and conducting layers (B) 230b to 234b. The gate electrodes 231 and 232 formed in the driver circuit are formed to overlap a part of the impurity regions 219 and 220, through the gate insulating film 222, at this point. (FIG. 10D)

Next, in order to form a source region and a drain region of the p-channel TFT of the driver circuit, a process of adding an impurity element that imparts p-type conductivity is performed. Impurity regions are formed in a self-aligning manner here with the gate electrode 230 as a mask. The region in which then-channel TFT is formed is covered with a photoresist mask 235. An impurity region (p$^+$) 234 at a concentration of $1\times10^{21}$ atoms/cm$^3$ is then formed by ion doping using diborane (B$_2$H$_6$). (FIG. 11A)

Formation of impurity regions for functioning as a source region or a drain region of the n-channel TFT is performed next. Resist masks 237 to 239 are formed, and an impurity element that imparts n-type conductivity is added, forming impurity regions 241 to 244. This is performed by ion doping using phosphine (PH$_3$), and the concentration of the impurity regions (n$^+$) 241 to 244 is set to $5\times10^{20}$ atoms/cm$^3$. (See FIG. 1B) Boron (B) is already contained in the impurity region 240 in a previous step, but in comparison, phosphorous (P) is added with a concentration of one-third to one-half that of the boron (B), and therefore the influence of phosphorous (P) need not be considered, and there is no influence imparted to the characteristics of the TFT.

A process of adding an impurity that imparts n-type conductivity is then performed in order to form an LDD region of the n-channel TFT of the pixel portion. An impurity element that imparts n-type conductivity is added by ion doping in a self-aligning manner using the gate electrode 233 as a mask. The concentration of phosphorous (P) added is set to $5\times10^{16}$ atoms/cm$^3$, and this is a lower concentration than that of the impurity elements added by the steps of FIG. 9A, FIG. 10A, and FIG. 10B, and in practice only impurity regions (n$^{--}$) 245 and 246 are formed. (FIG. 1C)

A heat treatment process is performed next (between 400 and 700° C.) in order to activate the impurity elements which impart n-type or p-type conductivity and have been added at various concentrations. Thermal annealing using an annealing furnace, laser annealing, or rapid thermal annealing (RTA) can be performed for this process. The activation process is performed here using furnace annealing.

Through thermal annealing, the W films 230b to 234b forming the gate electrodes 230 to 234, and the capacitor wiring 234, have conducting films (C) 230c to 234c, made from WN, formed in their surfaces to a thickness of 5 to 80 nm. In addition, when the conducting layers (B) 230b to 234b are titanium (Ti), titanium nitride (TiN) can be formed. Further, these can be formed similarly by exposing the gate electrodes 230 to 234 to a plasma atmosphere containing nitrogen using a substance such as nitrogen or ammonia. In addition, a process of hydrogenation of the island-shape semiconductor layers is performed by thermal annealing at 300 to 450° C. for between 1 and 12 hours in an atmosphere containing between 3 and 100% hydrogen. This process is the one of terminating dangling bonds $10^{16}\sim10^{18}$/cm$^3$ in the semiconductor layers by thermally excited hydrogen. Plasma hydrogenation (using hydrogen excited by a plasma) may be performed as another means of hydrogenation. (FIG. 1D)

Figure 14A:
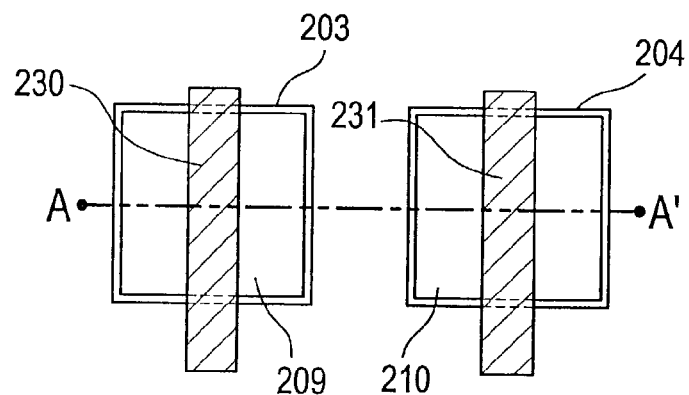
FIGS. 14(A) through 14(C) are top plan views showing the fabricating process for the active matrix substrate.

FIG. 14A are top views of the TFTs in FIG. 11D, and the cross portions taken along the A-A' lines correspond to A-A' in FIG. 1D.

After the activation and hydrogenation processes are completed, a second conducting layer is formed as a gate wiring. The second conducting layer is formed by a conducting layer (D) made from a low resistance material which has aluminum (Al) or copper (Cu) as its principal constituent. Whichever is used, the resistivity of the second conducting layer is set to between 0.1 and 10 μΩcm. In addition, a conducting layer (E) made from titanium (Ti), tantalum (Ta), tungsten (W), or molybdenum (Mo) may be laminated with the conducting layer (D). In the present embodiment, an aluminum (Al) film containing between 0.1 and 2% titanium (Ti) is formed as conducting layer (D) 247, and a titanium (Ti) film is formed as a conducting layer (E) 248. The conducting layer (D) 247 may be formed with a thickness of 200 to 400 nm (preferably 250 to 350 nm), and the conducting layer (E) 248 may be formed with a thickness of 50 to 200 nm (preferably 100 to 150 nm). (FIG. 12A)

The conducting layer (E) 248 and the conducting layer (D) 247 are then etched in order to form a gate wiring connected to the gate electrode, forming gate wirings 249 and 250 and a capacitor wiring 251.

Figure 14B:
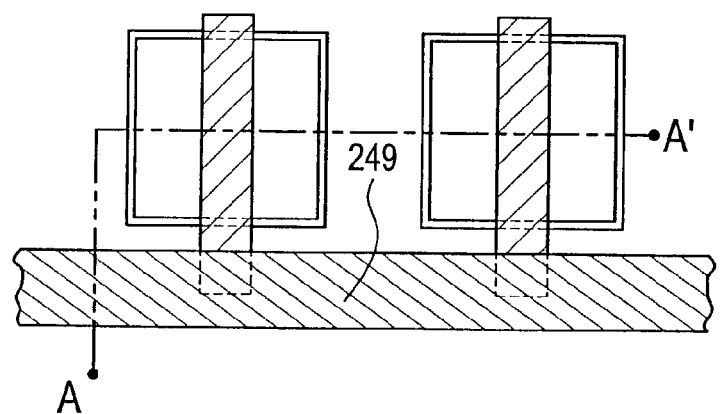

FIG. 14B show top views of this state, and the cross portions taken along the line A-A' correspond to the A-A' cross portions, respectively, in FIG. 12B.

A first interlayer insulating film 252 is formed from a silicon oxide film or a silicon oxynitride film with a thickness of between 500 and 1500 nm. This is formed in the present embodiment by setting SiH$_4$ to 27 SCCM, N$_2$O to 900 SCCM, with a reaction pressure of 160 Pa, a substrate temperature of 325° C., and a discharge power density of 0.15 W/cm$^2$. Contact holes for reaching a source region or a drain region formed in the respective island-shape semiconductor layers are then formed, and source wirings 253 to 256, and drain wirings 257 to 260 are formed. Although not shown in the figures, in the present embodiment these electrodes are laminate films with a three layer structure of a 100 nm Ti film, a 300 nm aluminum film containing Ti, and a 150 nm Ti film formed in succession by sputtering.

Next, a silicon nitride film, a silicon oxide film or a silicon oxynitride film with a thickness of between 50 and 500 nm (typically between 100 and 300 nm) is formed as a passivation film 261. If hydrogenation processing is performed in this state, then the desirable result as to the improvement of TFT characteristics can be obtained. For example, it is good to perform heat treatment for between 1 and 12 hours at 300 to 450° C. in an atmosphere of 3 to 100% hydrogen, and a similar effect can be obtained by using plasma hydrogenation. By this heat treatment, hydrogen in first interlayer insulating film 252 can be diffused to island-shaped semiconductor film 209 and 210b to 212b and hydrogenated. (FIG. 12C) Note that openings may be formed in the passivation film 261 in positions in which contact holes for connecting to the pixel electrode, and to the drain wiring, will later be formed.

Figure 14C:
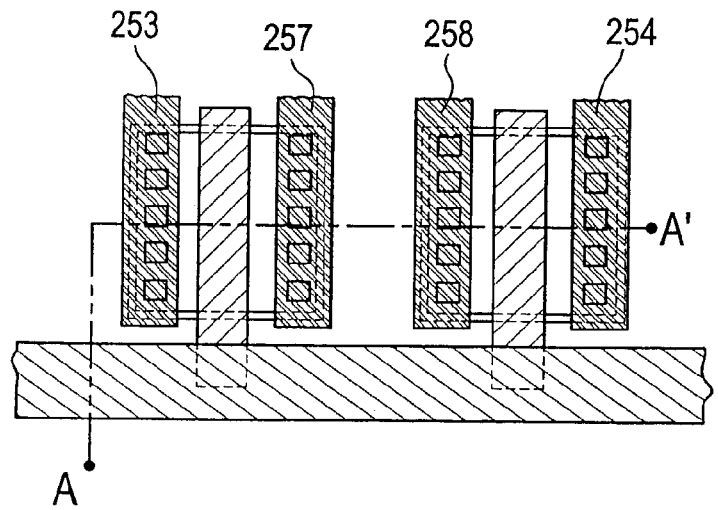

FIG. 14C show top views of this state, and the cross portions taken along the line A-A' correspond to the A-A' cross portions, respectively, in FIG. 12C.

Figure 13:
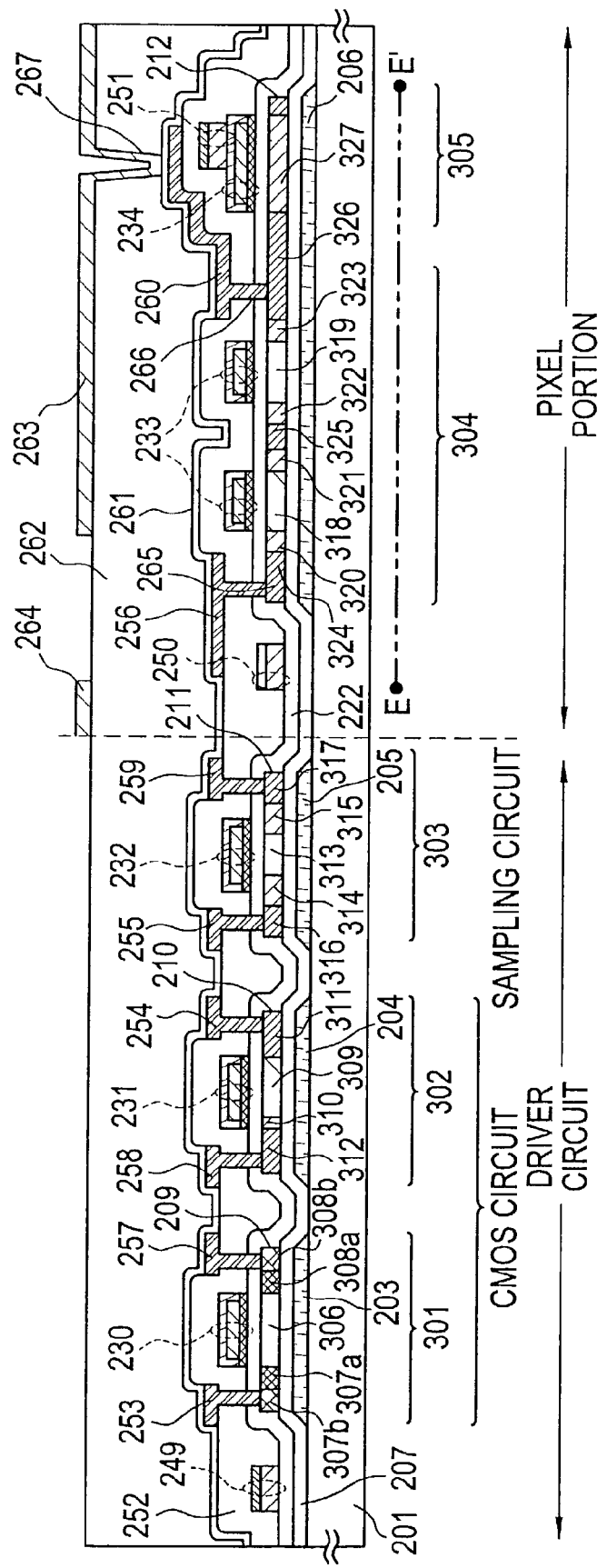
FIG. 13 is a sectional view showing the fabricating process for the active matrix substrate.

A second interlayer insulating film 262 is formed next from an organic resin with a thickness of 1.0 to 1.5 μm. Materials such as polyimide, acrylic, polyamide, polyimide amide, and BCB (benzocyclobutane) can be used as the organic resin. A thermal polymerization type polyimide is used here, and this is baked at 300° C. after application to the substrate. A contact hole for reaching the drain wiring 260 is then formed in the second interlayer insulating film 262, and pixel electrodes 263 and 264 are formed. A transparent conducting film is used for the pixel electrodes in a transmitting type liquid crystal display device, and a metallic film is used in a reflecting type liquid crystal display device. A transmitting type liquid crystal display device is used in the present embodiment, and therefore a 100-nm thick indium tin oxide (ITO) film is formed by sputtering. (FIG. 13)

The substrate having the TFTs of the driver circuit and the pixel TFT of the pixel portion on the same substrate is thus completed. A p-channel TFT 301, a first n-channel TFT 302, and a second n-channel TFT 303 are formed in the driver circuit, and a pixel TFT 304 and a storage capacitor 305 are formed in the pixel portion. For convenience, this type of substrate is referred to as an active matrix substrate throughout this specification.

In all thermal process of above-mentioned active matrix substrate, it is necessary to be careful to place the temperature within the range of endurable temperature of organic resin film 203 to 206.

The P-channel TFT 301 of the driver circuit has a channel forming region 306, source regions 307a and 307b, and drain regions 308a and 308b in the island-like semiconductor layer 209. The first n-channel TFT 302 has a channel forming region 309, an LDD region ($L_{ov}$) 310 overlapping the gate electrode 231, a source region 311, and a drain region 312 in the island-like semiconductor layer 210. The length of the $L_{ov}$ region in the channel length direction is from 0.5 to 3.0 μm, preferable between 1.0 and 1.5 μm. A channel forming region 313, an $L_{ov}$ region, and an $L_{off}$ region (an LDD region which does not overlap the gate electrode, hereafter referred to as an $L_{off}$ region) are formed in the island-like semiconductor layer 211 of the second n-channel TFT 303, and the length of the $L_{off}$ region in the channel length direction is from 0.3 to 2.0 μm, preferably between 0.5 and 1.5 μm. The island-like semiconductor layer 212 of the pixel TFT 304 has channel forming regions 318 and 319, $L_{off}$ regions 320 to 323, and source or drain regions 324 to 326. The length of the $L_{off}$ region in the channel length direction is from 0.5 to 3.0 μm, preferably between 1.5 and 2.5 μm. In addition, the storage capacitor 305 is formed from the capacitor wirings 234 and 251, an insulating film made from the same material as the gate insulating film, and a semiconductor layer 327 connected to the drain region 326 of the pixel TFT 304 and in which has an added impurity element that imparts n-type conductivity. In FIG. 12 a double gate structure is used for the pixel TFT 304, but a single gate structure may be used, and a multi-gate structure in which a plural number of gates are formed may also be used without hindrance.

With the present composition as above, the TFT structures forming each circuit can be optimized in accordance with the required specification of the pixel TFT and the driver circuit, and it is possible to improve the operational performance of, and the reliability of, the semiconductor device. In addition, by forming the gate electrodes with a conducting material having heat resistance properties, activation of the LDD regions, the source regions, and the drain regions is easy, and by forming the gate wirings with a material having low electrical resistance, the resistance of the wirings can be sufficiently reduced. It is therefore possible to apply the present invention to a display device having a display region (screen size) of 4 inches or more. And, using a crystalline semiconductor film, which is formed selectively on the organic resin film 203 to 206 forming the base layer makes it possible to perform the superior characteristics in complete TFT.

Embodiment 7

In the present embodiment, a process of manufacturing an active matrix type liquid crystal display device from the active matrix substrate of embodiment 6 is explained. As shown in FIG. 15, an alignment film 601 is formed on the active matrix substrate in the state of FIG. 13. A polyimide resin is often used for the alignment film of a liquid crystal display device. A light shielding film 603, a transparent conductive film 604, and an alignment film 605 are formed on an opposing substrate 602, which is an opposing side. After forming the alignment films, a rubbing process is performed so that the liquid crystal molecules are oriented with a certain fixed pre-tilt angle. The active matrix substrate, on which the pixel portion and the CMOS circuit are formed, and the opposing substrate are then joined together by a sealing material or spacers (both not shown in the figures) in accordance with a known cell construction process. Next, a liquid crystal material 606 is injected between both substrates, and the cell is completely sealed by an end-sealing material (not shown in the figures). A known liquid crystal material may be used as the liquid crystal material. Thus the active matrix type liquid crystal display device shown in FIG. 15 is completed.

Figure 16:
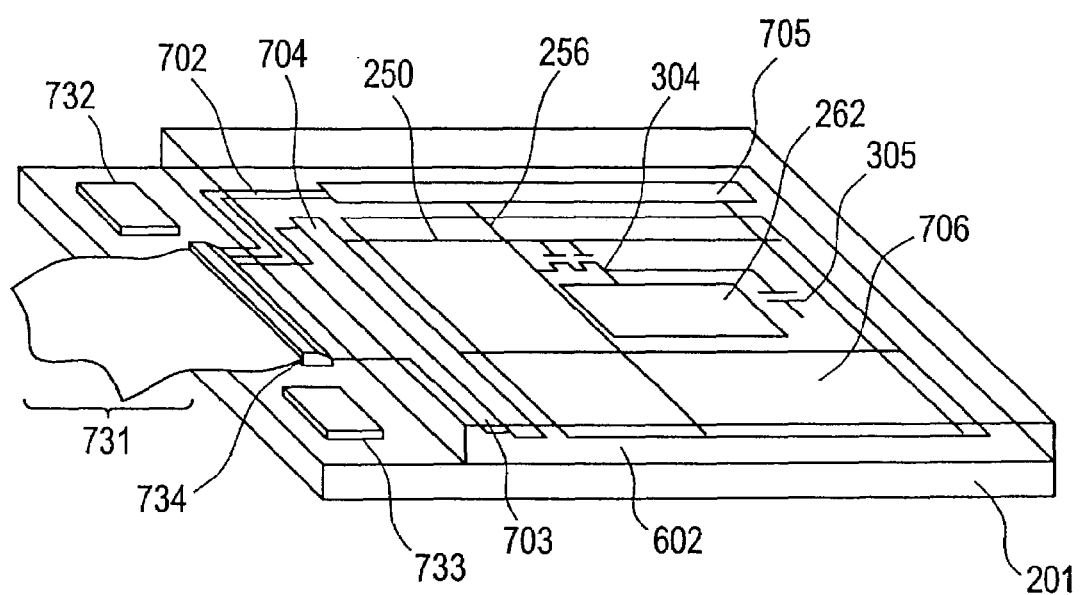
FIG. 16 is a perspective view showing the external appearance of the AM-LCD.
Figure 17:
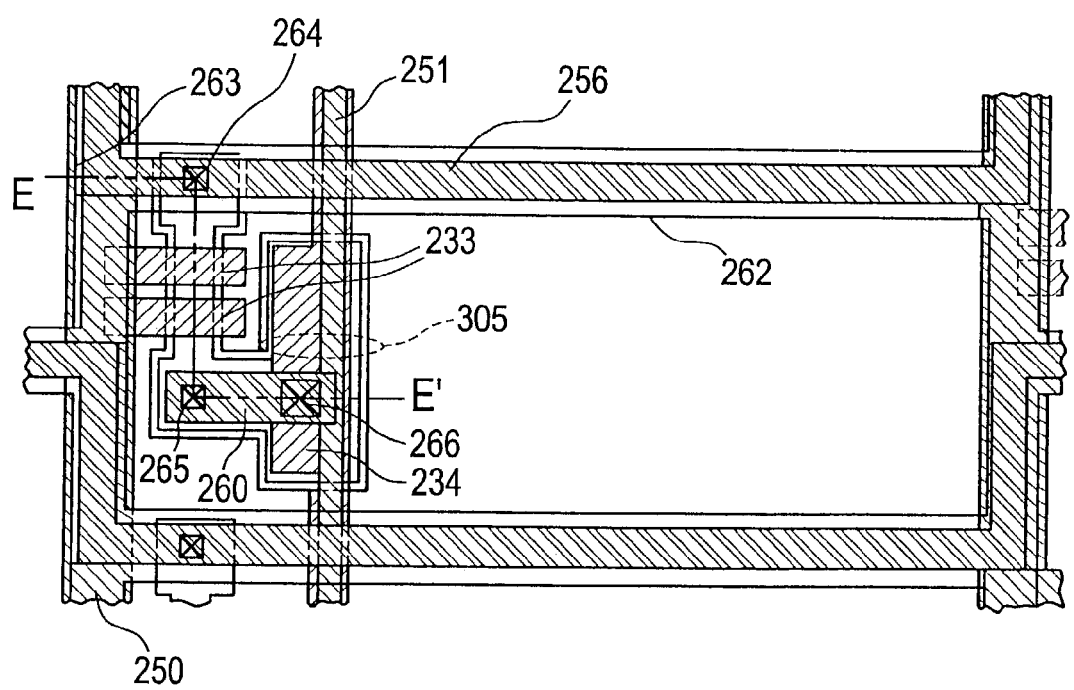
FIG. 17 is a top plan view showing one pixel in the AM-LCD.

Next, the structure of the active matrix type liquid crystal display device is explained using the perspective view of FIG. 16 and the top view of FIG. 17. Note that FIG. 16 and FIG. 17 correspond to the cross-sectional structure views of FIGS. 9 to 13 and FIG. 19 and therefore common symbols are used. Further, the cross-sectional structure taken along the line E-E' shown in FIG. 17 corresponds to the cross-sectional view of the pixel matrix circuit shown in FIG. 13.

In FIG. 16, the active matrix substrate is composed of a pixel portion 706, a scanning signal driver circuit 704, and an image signal driver circuit 405 formed on the glass substrate 201. The pixel TFT 304 is formed in the display region, and the driver circuit formed in the periphery thereof is structured based on a CMOS circuit. The scanning signal driver circuit 704 and the image signal driver circuit 705 are connected to the pixel TFT 304 by the gate wiring 250 and the source wiring 256, respectively. Further, an FPC (flexible print circuit) 731 is connected to an external input terminal 734, and input wirings 402 and 403 are connected to the respective driver circuits.

FIG. 17 is a top view showing nearly one full pixel of the display region 706. The gate wiring 250 intersects, through a gate insulating film not shown in the figure, with the semiconductor layer 212 underneath. A source region, a drain region, and an Loff region made from an n⁻⁻ region, are formed in the semiconductor layer, although not shown in the figure. Further, reference numeral 265 denotes a contact area of the source wiring 256 and the source region 324, reference numeral 266 denotes a contact area of the drain wiring 260 and the drain region 326 (not shown), and reference numeral 267 denotes a contact area of the drain wiring 260 and the pixel electrode 263. The storage capacitor 305 is formed of the region in which the semiconductor layer 327 extending from the drain region 326 of the pixel TFT 304 overlaps the capacitor wirings 234 and 251 through the gate insulating film.

Note that the active matrix type liquid crystal display device of the present embodiment is explained with reference to the structure explained in embodiment 6, but the structure is not limited to that of embodiment 6; an active matrix substrate fabricated by applying the structure shown in Embodiments 1 to 5 may be used. Whichever is used, if only it is an active matrix substrate, an active matrix type liquid crystal display device can be formed by freely combination of active matrix substrates.

Embodiment 8

In this embodiment, there will be described an instance in which an EL (electroluminescent) display panel (also termed "EL display devices") is fabricated by adopting the invention.

Figure 19A:
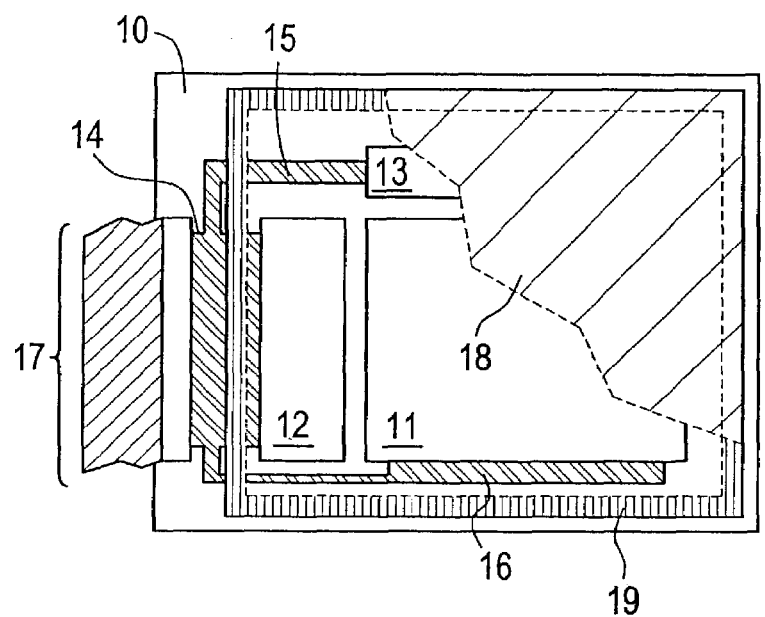
FIGS. 19(A) and 19(B) are a top plan view and a sectional view showing an example of construction of an EL display device, respectively.

FIG. 19(A) is a top plan view of the EL display panel adopting the present invention. Referring to the figure, numeral 10 designates a substrate, numeral 11 a pixel unit, numeral 12 a source side driver circuit, and numeral 13 a gate side driver circuit. The respective driver circuits are led to an FPC 17 via wiring lines 14-16, and are connected to an external equipment.

Figure 19B:
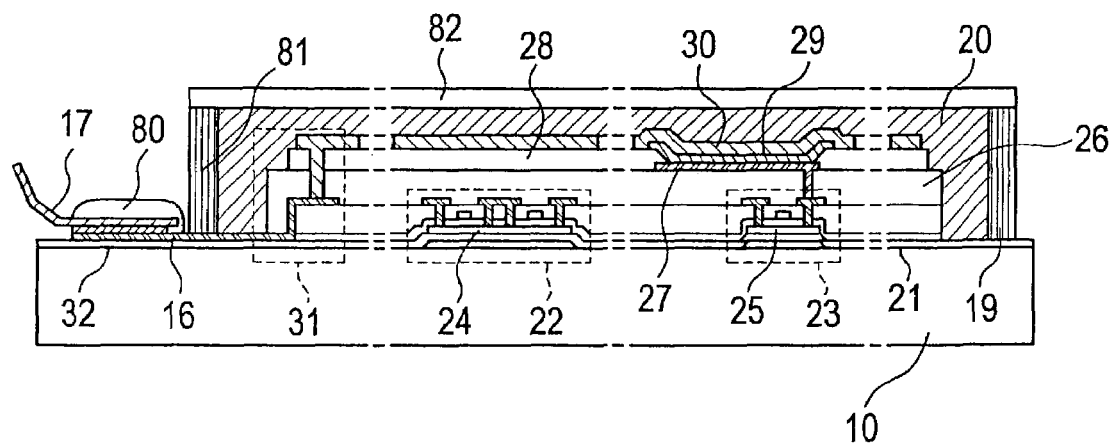

On this occasion, a board 82 (FIG. 19(B)) is disposed so as to cover, at least, the pixel unit, and preferably, the driver circuits and the pixel unit. Incidentally, a glass plate or a plastics plate may be employed for the board 82, and an ultraviolet-hardening resin may well be employed therefor. In the case of disposing the board 82, it is fastened to the substrate 10 by adhesives 81 (FIG. 19(B)), and a resin 20 (FIG. 19(B)) is packed between the board 82 and the substrate 10. On this occasion, the EL element are completely sealed with the resin 20 and are completely cut off from the open air.

Alternatively, a closed space may well be defined between the board 82 and the substrate 10 so as to be filled up with an inert gas (such as argon, helium or nitrogen) or to have a drying agent (such as barium oxide) put therein. Thus, the deterioration of the EL element attributed to moisture etc. can be suppressed.

Besides, FIG. 19(B) illustrates the sectional structure of the EL display panel of this embodiment. TFTs for the driver circuit, 22 (here, a CMOS circuit in which an NTFT and a PTFT are combined is depicted), and a TFT for the pixel unit, 23 (here, only the TFT for controlling a current toward the EL element is depicted) are formed on the substrate 10 as well as an inorganic insulating film 21. The NTFT (n-channel TFT) and PTFT (p-channel TFT) shown in FIG. 7(E) may well be employed as the TFTs for the driver circuit, 22. Also, the NTFT or PTFT shown in FIG. 7(E) may well be employed as the TFT for the pixel unit, 23.

When the driver circuit TFTs 22 and the pixel unit TFT 23 have been finished up by adopting the present invention, a pixel electrode 27 which is made of a transparent conductive film and which is electrically connected with the drain of the pixel unit TFT 23 is formed on an inter-layer insulating film (a flattening film) 26 which is made of a resin material. A compound (called "ITO") of indium oxide and tin oxide, or a compound of indium oxide and zinc oxide can be used for the transparent conductive film. Besides, after the formation of the pixel electrode 27, an insulating film 28 is deposited and is formed with an opening on the pixel electrode 27.

Subsequently, an EL layer 29 is formed. The EL layer 29 may be constructed into a multilayer structure or a single-layer structure by optionally combining known EL materials (a hole injection layer, a hole transport layer, a luminescent layer, an electron transport layer, and an electron injection layer). The structure may be determined by known techniques. Besides, the EL materials are classified into low-molecular materials and high-molecular (polymer) materials. In case of employing the low-molecular material, vapor deposition is relied on, whereas in case of employing the high-molecular material, a simple method such as spin coating, ordinary printing or ink jet printing can be relied on.

In this embodiment, the EL layer is formed in accordance with vapor deposition by employing a shadow mask. Luminescent layers (red luminescent layer, green luminescent layer and blue luminescent layer) capable of luminescences of different wavelengths are formed every pixel by employing the shadow mask, whereby a color display becomes possible. There are also a scheme in which color conversion measures (CCM) and color filters are combined, and a scheme in which a white luminescent layer and color filters are combined, and any of such methods may well be employed. Of course, an EL display panel of monochromatic luminescence can be constructed.

After the EL layer 29 has been formed, it is overlaid with a cathode 30. Moisture and oxygen to exist at the boundary between the cathode 30 and the EL layer 29 should desirably be excluded to the utmost beforehand. Accordingly, such a contrivance is required that the EL layer 29 and the cathode 30 are successively formed in vacuum, or that the EL layer 29 is formed in an inactive atmosphere, followed by forming the cathode 30 without exposing the resulting substrate to the atmospheric air. In this embodiment, the film formation as explained above is incarnated by employing a film forming equipment of multichamber system (cluster tool system).

By the way, in this embodiment, a multilayer structure consisting of an LiF (lithium fluoride) film and an Al (aluminum) film is employed for the cathode 30. More concretely, the LiF film being 1 nm thick is formed on the EL layer 29 by vapor deposition, and it is overlaid with the Al film being 300 nm thick. It is, of course, allowed to employ an MgAg electrode which is a known cathode member. Besides, the cathode 30 is connected to the wiring line 16 in a region which is indicated by numeral 31. The wiring line 16 is a supply voltage feeder line for applying a predetermined voltage to the cathode 30, and it is connected to the FPC 17 through a conductive paste material 32. Besides, the portion of the connection is covered with a resin 80 so as to be protected.

For the purpose of electrically connecting the cathode 30 and the wiring line 16 in the region 31, contact holes need to be formed in the inter-layer insulating film 26 and the insulating film 28. They may be previously formed at the etching of the inter-layer insulating film 26 (at the formation of the contact hole for the pixel electrode) and at the etching of the insulating film 28 (at the formation of the opening before the formation of the EL layer). Alternatively, in etching the insulating film 28, also the inter-layer insulating film 26 may be etched in collective fashion. In this case, if the inter-layer insulating film 26 and the insulating film 28 are made of the same resin material, the contact holes can be formed into favorable shapes.

In addition, the wiring line 16 is electrically connected to the FPC 17 by passing through the gap between the board 82 and the substrate 10 (as is filled up with the adhesives 81). Although the wiring line 16 has been explained here, the other wiring lines 14 and 15 are electrically connected to the FPC 17 by passing under the board 82, likewise to the wiring line 16.

Figure 20:
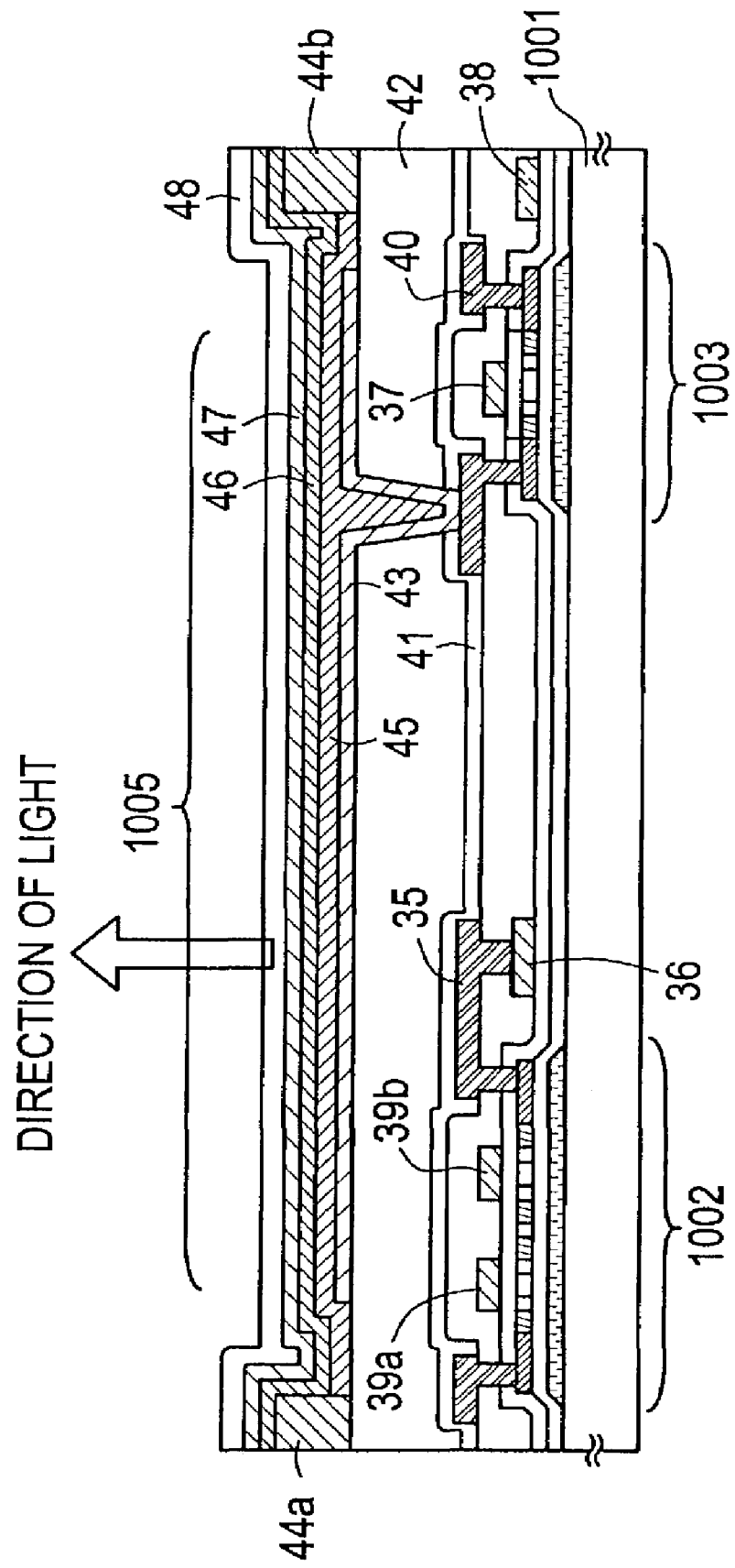
FIG. 20 is a sectional view showing the example of construction of the EL display device.

The present invention can be utilized in the EL display panel constructed as explained above. The more detailed sectional structure of the pixel unit is illustrated in FIG. 20, the top plan structure thereof is done in FIG. 21(A), and the circuit diagram thereof is done in FIG. 21(B). Since common reference numerals are used in FIG. 20 and FIGS. 21(A) and 21(B), these figures may be cross-referred.

Referring to FIG. 20, a switching TFT 1002 provided on a substrate 1001 is formed by employing the NTFT of the present invention. In this embodiment, the switching TFT 1002 is formed as a double-gate structure. Since the construction and fabricating process of the double-gate structure are not greatly different from those of a single-gate structure, they shall be omitted from description. However, the double-gate structure is a structure in which two TFTs are, in effect, connected in series, and it has the merit that an OFF current value can be decreased. Although the double-gate structure is employed in this embodiment, it may well be replaced with the single-gate structure or with a triple-gate structure or a multi-gate structure having three or more gates. Further, the switching TFT 1002 may well be formed by employing the PTFT of the invention.

Besides, a current controlling TFT 1003 is formed by employing the NTFT of the present invention. On this occasion, the drain wiring line 35 of the switching TFT 1002 is electrically connected to the gate electrode 37 of the current controlling TFT 1003 by a wiring line 36. Also, a wiring line indicated at numeral 38 is a gate wiring line which electrically connects the gate electrodes 39a, 39b of the switching TFT 1002.

In this case, it has a very important significance that the current controlling TFT 1003 has the structure of the present invention. Since the current controlling TFT 1003 is an element for controlling the magnitude of a current to flow through the EL element, it is an element through which a large amount of current flows and which is highly liable to deterioration ascribable to heat and also deterioration ascribable to hot carriers. Therefore, that structure of the present invention in which an LDD region is provided on the drain side of the current controlling TFT 1003 so as to overlap the gate electrode 37 through a gate insulating film is very effective.

In addition, although the current controlling TFT 1003 is shown as a single-gate structure in this embodiment, it may well have a multi-gate structure in which a plurality of TFTs are connected in series. Further, it may well have a structure in which a plurality of divided channel forming regions are, in effect, formed by connecting a plurality of TFTs in parallel, whereby heat can be radiated at a high efficiency. Such a structure is effective as a measure against the deterioration ascribable to the heat.

Figure 21A:
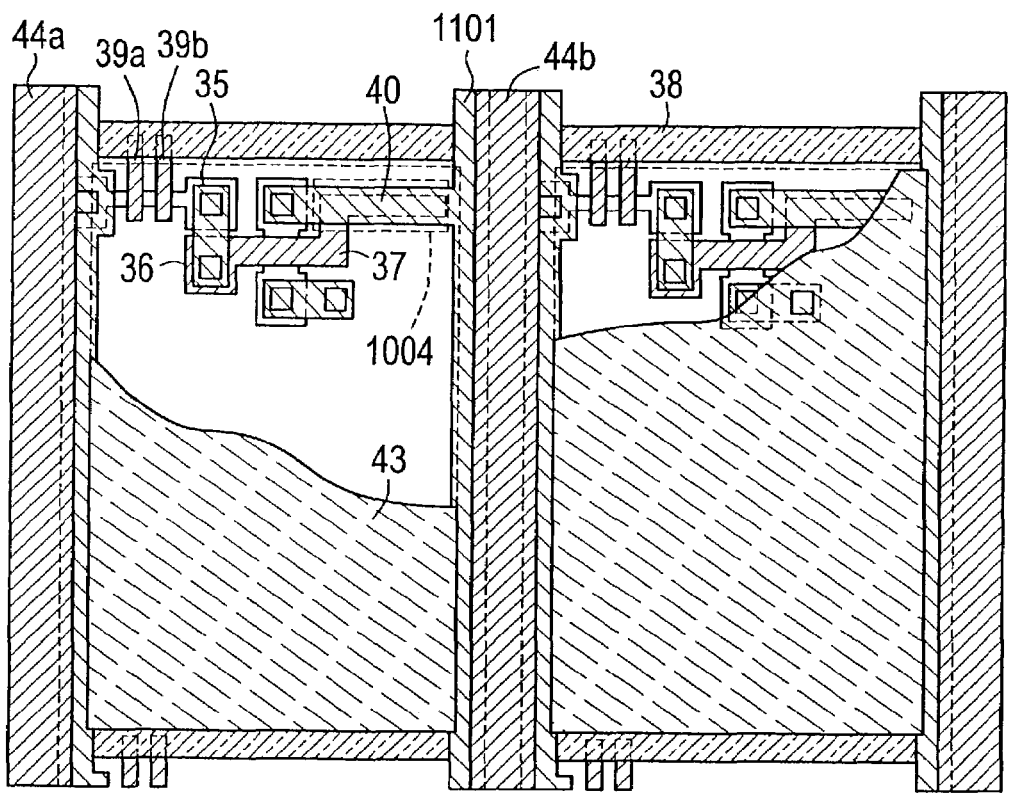
FIGS. 21(A) and 21(B) are a top plan view and a circuit diagram showing another example of construction of an EL display device, respectively.

As shown in FIG. 21(A), a wiring line to serve as the gate electrode 37 of the current controlling TFT 1003 overlies the drain wiring line 40 of the current controlling TFT 1003 through an insulating film in a region indicated at numeral, 1004. On this occasion, a capacitor is formed in the region 1004. The capacitor 1004 functions to hold a voltage which is applied to the gate of the current controlling TFT 1003. Incidentally, the drain wiring line 40 is connected to a current feeder line (power supply line) 1101 and is kept supplied with a constant voltage.

A first passivation film 41 is provided on the switching TFT 1002 and the current controlling TFT 1003, and it is overlaid with a flattening film 42 made of a resin insulating film. It is very important to flatten stepped parts ascribable to the TFTs, by employing the flattening film 42. Since an EL layer to be formed later is very thin, it sometimes incur an inferior luminescence due to the existence of the stepped parts. It is accordingly desirable to flatten the substrate structure before the formation of a pixel electrode so that the EL layer can be formed as flat as possible.

In addition, numeral 43 designates the pixel electrode (the cathode of the EL element) which is made of an electrically conductive film of high reflectivity, and which is electrically connected to the drain of the current controlling TFT 1003. The pixel electrode 43 should preferably be formed of a conductive film of low resistance, such as an aluminum alloy film, a copper alloy film or a silver alloy film, or a multilayer film consisting of, at least, two of the above conductive films. Of course, a multilayer structure including any other conductive film may well be employed for the pixel electrode 43.

Besides, a luminescent layer 45 is formed in a groove (corresponding to a pixel) which is defined by banks 44a, 44b made of an insulating film (preferably, of resin). Incidentally, although only one pixel is illustrated here, luminescent layers corresponding to the respective colors of R (red), G (green) and B (blue) may well be separately formed. Any of π conjugate polymeric materials is employed as an organic EL material for the luminescent layer 45. Typical polymeric materials are based on polyphenylene vinylene (PPV), polyvinyl carbazole (PVK), polyfluorene, etc.

Although the PPV-based organic EL materials include various types, it is recommended to employ any of materials stated in, for example, H. Shenk, H. Becker, O. Gelsen, E. Kluge, W. Kreuderand H. Spreitzer: "Polymers for Light Emitting Diodes", Euro Display, Proceedings, 1999, pp. 33-37, or the official gazette of Japanese Patent Application Laid-open No. 92576/1998.

Regarding practicable luminescent layers, cyanopolyphenylene vinylene may be used for the luminescent layer luminescing in red, polyphenylene vinylene for the luminescent layer luminescing in green, and polyphenylene vinylene or polyalkylphenylene for the luminescent layer luminescing in blue. The thickness of the luminescent layer 45 may be set at 30 nm-150 nm (preferably, 40 nm-100 nm).

The materials mentioned above are mere examples of the organic EL materials applicable to the luminescent layer 45, and they are not restrictive at all. The EL layer (a layer which serves to luminesce and to move carriers for the luminescence) may be formed by optionally combining the luminescent layer and the charge transport layer or charge injection layer).

By way of example, although the polymeric material has been mentioned as the material of the luminescent layer 45 in this embodiment, a low-molecular organic EL material may well be employed. Also, an inorganic material such as silicon carbide can be employed for the charge transport layer or the charge injection layer. Such an organic EL material and an inorganic material may be any of known materials.

In this embodiment, the EL layer has a multilayer structure in which the luminescent layer 45 is overlaid with a hole injection layer 46 made of PEDOT (polythiophene) or PAni (polyaniline). Besides, the hole injection layer 46 is overlaid with an anode 47 which is formed of a transparent conductive film. In the case of this embodiment, light generated by the luminescent layer 45 is radiated toward the upper side of the substrate structure (upwards of the TFTs), and hence, the anode 47 must be light-transmissive. A compound of indium oxide and tin oxide, or a compound of indium oxide and zinc oxide can be used for the transparent conductive film. Since the transparent conductive film is formed after the formation of the luminescent layer 45 and hole injection layer 46 of low refractoriness, it should preferably be made of a material which can be deposited at the lowest possible temperature.

When the anode 47 has been formed, the EL element 1005 is finished up. Incidentally, the "EL element 1005" here signifies a capacitor which is constituted by the pixel electrode (cathode) 43, luminescent layer 45, hole injection layer 46 and anode 47. Since the area of the pixel electrode 43 is substantially in agreement with that of one pixel as seen from FIG. 21(A), the whole pixel functions as the EL element 1005. Accordingly, the utilization efficiency of the luminescence is very high, and a bright image display is realized.

Meanwhile, in this embodiment, the anode 47 is further overlaid with a second passivation film 48. A silicon nitride film or a nitrified silicon oxide film is favorable as the second passivation film 48. This film 48 has the purpose of cutting off the EL element 1005 from the exterior, and it has both the significance of preventing the deterioration of the organic EL material attributed to oxidation and the significance of suppressing degassing from the organic EL material. Thus, the reliability of the EL display device is heightened.

As described above, the EL display panel of the present invention includes the pixel unit formed of the pixel of the structure as shown in FIG. 20, and it also includes the switching TFT of sufficiently low OFF current and the current controlling TFT immune against the injection of hot carriers as shown in FIG. 20. It is accordingly possible to offer the EL display panel which has a high reliability and which is capable of good image display.

By the way, the construction of this embodiment can be performed by being optionally combined with the constructions of Embodiments 1-7.

Embodiment 9

In this embodiment, there will be described a construction in which the structure of the EL element 1005 is reversed in the pixel unit stated in Embodiment 8. Reference will be had to FIG. 22. Incidentally, since the points of difference from the structure shown in FIG. 21(A) lie only in parts of the EL element and the current controlling TFT, the others shall be omitted from description.

Referring to FIG. 22, a current controlling TFT 1201 is formed using the PTFT of the invention. Regarding a fabricating process for the TFT 1201, Embodiment 1 may be referred to.

In this embodiment, a transparent conductive film is employed as a pixel electrode (anode) 50. Concretely, the conductive film is made of a compound of indium oxide and zinc oxide. Of course, a conductive film made of a compound of indium oxide and tin oxide may well be employed.

Besides, after banks 51a and 51b made of an insulating film have been formed, a luminescent layer 52 made of polyvinylcarbazole is formed on the basis of the application of a solution. The luminescent layer 52 is overlaid with an electron injection layer 53 made of potassium acetylacetonate (expressed as "acacK"), and a cathode 54 made of an aluminum alloy. In this case, the cathode 54 functions also as a passivation film. Thus, an EL element 1202 is formed.

In the case of this embodiment, light generated by the luminescent layer 52 is radiated toward a substrate 1001 formed with TFTs as indicated by an arrow. When the structure as in this embodiment is employed, the current controlling TFT 1201 should preferably be formed of the PTFT.

By the way, the construction of this embodiment can be performed by being optionally combined with the constructions of Embodiments 1-7.

Embodiment 10

In this embodiment, examples in the case where a pixel has a structure different from that of the circuit diagram shown in FIG. 21(B) will be described with reference to FIGS. 23(A)-23(C). Here in this embodiment, numeral 1301 designates the source wiring line of a switching TFT 1302, numeral 1303 the gate wiring line of the switching TFT 1302, numeral 1304 a current controlling TFT, numeral 1305 a capacitor, each of numerals 1306 and 1308 a current feeder line, and numeral 1307 an EL element.

Figure 23A:
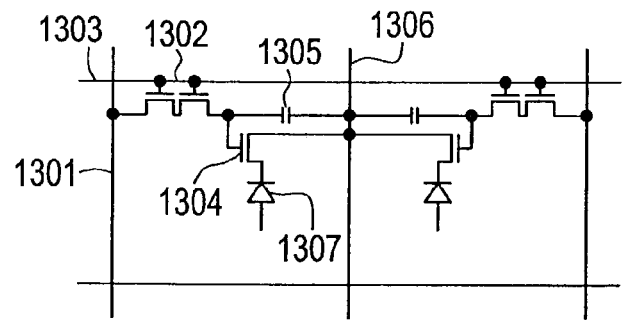
FIGS. 23(A) through 23(C) are circuit diagrams each showing yet another example of construction of an EL display device.

FIG. 23(A) illustrates the example in the case where the current feeder line 1306 is made common to two pixels. That is, this example features that the two pixels are formed in line symmetry with respect to the current feeder line 1306. In this case, the number of the supply voltage feeder lines can be decreased, so that a pixel unit can be endowed with a still higher definition.

Figure 23B:
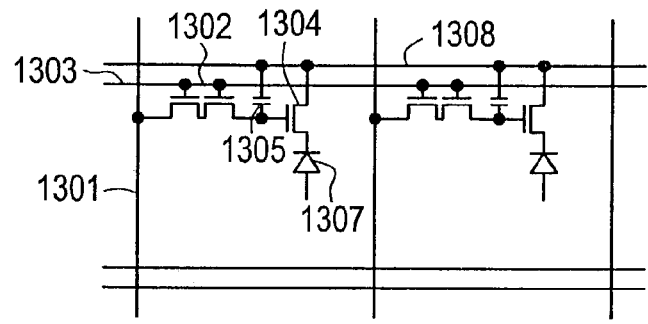

Besides, FIG. 23(B) illustrates the example in the case where the current feeder line 1308 is laid in parallel with the gate wiring line 1303. In the structure of FIG. 23(B), the current feeder line 1308 and the gate wiring line 1303 are laid so as not to overlie each other, but when both the wiring lines 1308 and 1303 are formed in different layers, they can be laid so as to overlie each other through an insulating film. Since, in this case, the supply voltage feeder line 1308 and the gate wiring line 1303 can share an occupation area, a pixel unit can be endowed with a still higher definition.

Figure 23C:
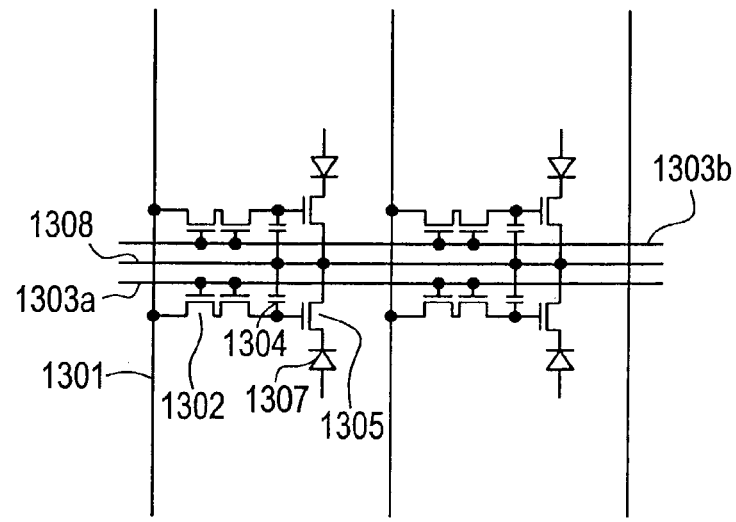

In addition, the example illustrated in FIG. 23(C) features that the current feeder line 1308 is laid in parallel with the gate wiring line 1303 in the same manner as in the structure of FIG. 23(B), and further that two pixels are formed in line symmetry with respect to the current feeder line 1308. It is also effective that the current feeder line 1308 is laid so as to overlie either of the gate wiring lines 1303 of the two pixels. In this case, the number of the supply voltage feeder lines can be decreased, so that a pixel unit can be endowed with a still higher definition.

By the way, the construction of this embodiment can be performed by being optionally combined with the construction of Embodiment 8 or Embodiment 9.

Embodiment 11

Figure 21B:
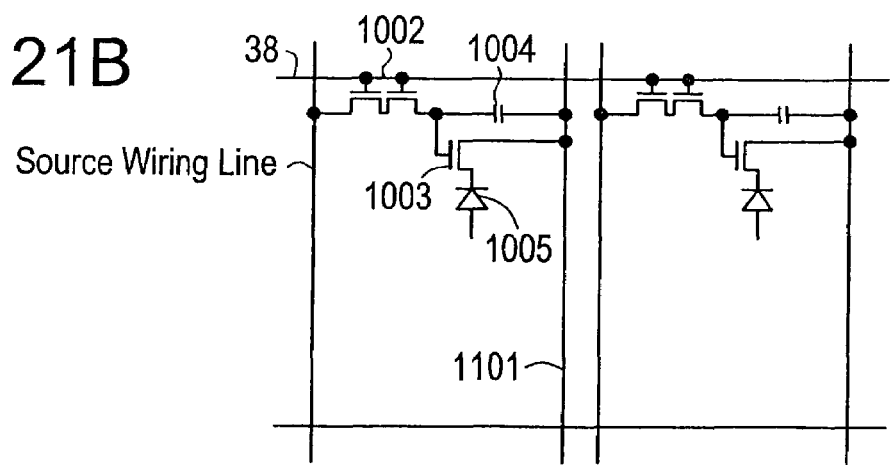

In the structure of Embodiment 8 shown in FIGS. 21(A) and 21(B), the capacitor 1004 is disposed in order to hold the voltage applied to the gate of the current controlling TFT 1003. It is also possible, however, to dispense with the capacitor 1004.

In the case of Embodiment 8, the NTFT of the present invention as shown in FIG. 20 is employed as the current controlling TFT 1003, so that the LDD region provided so as to be overlapped by the gate electrode through the gate insulating film is included. A parasitic capacitance generally called "gate capacitance" is formed in the overlapping domain. Embodiment 11 features that the parasitic capacitance is positively utilized instead of the capacitor 1004.

Since the magnitude of the parasitic capacitance changes depending upon the area of the overlap between the gate electrode and the LDD region, it is determined by the length of the LDD region included in the overlapping domain.

Also in each of the structures of Embodiment 10 as shown in FIGS. 23(A), 23(B) and 23(C), the capacitor 1305 can be similarly dispensed with.

By the way, the construction of this embodiment can be performed by being optionally combined with the construction of Embodiment 8 or Embodiment 9.

Embodiment 12

The CMOS circuit and the pixel portion formed by implementing the present invention can be used in various electro-optical devices (active matrix type liquid crystal display device, EL display device, and active matrix EC display). That is, the present invention can be implemented in all electronic equipment that incorporate these electro-optical devices as a display portion.

The following can be given as such electronic equipment: a video camera, a digital camera, a projector (a rear type or a front type), a head mount display (goggle type display), a car navigation system, a car stereo, a personal computer, a portable information terminal (such as a mobile computer, a cellular phone, and an electronic book) etc. Some examples of these are shown in FIG. 24, FIG. 25 and FIG. 26.

Figure 24A:
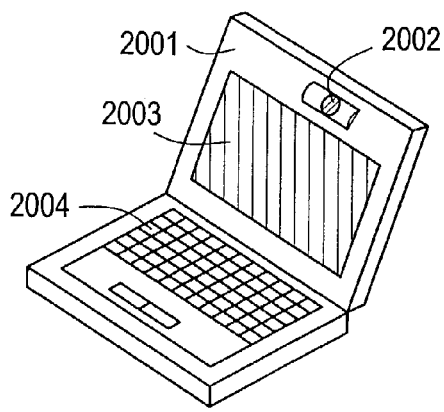
FIGS. 24(A) through 24(F) are schematic views each showing an example of electronic equipment.

FIG. 24A shows a personal computer that is comprised of a main body 2001, an image input portion 2002, a display portion 2003, and a keyboard 2004. The present invention can be applied to the display portion 2003, the image input portion 2002 and the other signal control circuit.

Figure 24B:
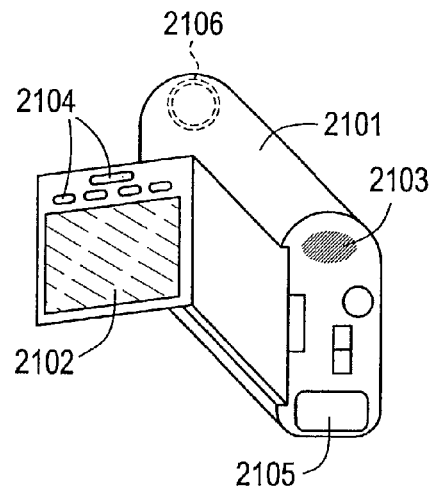

FIG. 24B shows a video camera that is comprised of a main body 2101, a display portion 2102, an audio input portion 2103, operation switches 2104, a battery 2105, and an image receiving portion 2106. The present invention can be applied to the display portion 2102, and other signal control circuit.

Figure 24C:
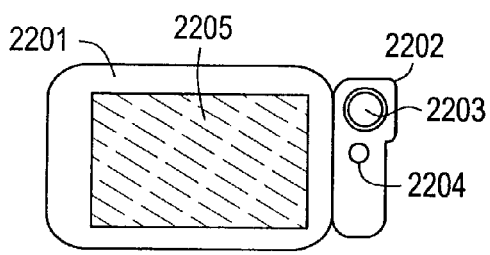

FIG. 24C shows a mobile computer that is composed of a main body 2201, a camera portion 2202, an image receiving portion 2203, operation switches 2204, and a display portion 2205. The present invention can be applied to the display portion 2205 and other signal control circuit.

Figure 24D:
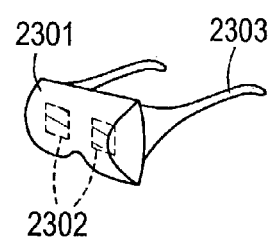

FIG. 24D shows a goggle type display that is comprised of a main body 2301, display portions 2302, and arm portions 2303. The present invention can be applied to the display portion 2302 and other signal control circuit.

Figure 24E:
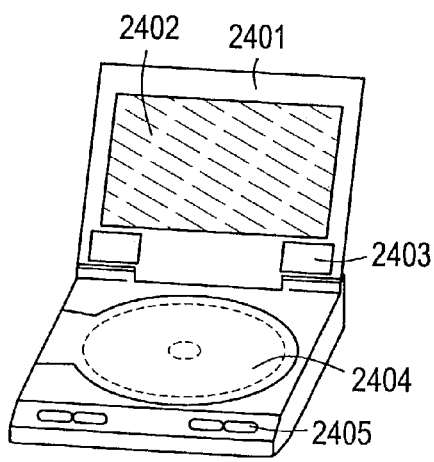

FIG. 24E shows a player which uses a recording medium in which a program is stored (hereinafter referred to as a recording medium) and which is comprised of a main body 2401, a display portion 2402, speaker portions 2403, a recording medium 2404, and operation switches 2405. A DVD (Digital Versatile Disc), a CD or the like is used as the recording medium to enable the player to appreciate music and the movies, and play a game or the Internet. The present invention can be applied to the display portion 2402 and other signal control circuit.

Figure 24F:
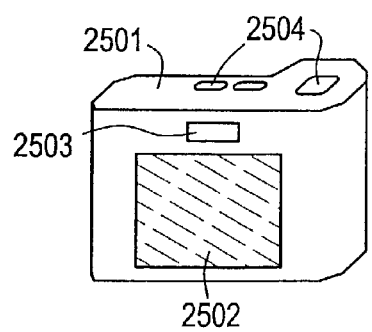

FIG. 24F shows a digital camera that is comprised of a main body 2501, a display portion 2502, an eye-piece portion 2503, operation switches 2504, and an image receiving portion (not shown in the figure). The present invention can be applied to the display portion 2502 and other signal control circuit.

Figure 25A:
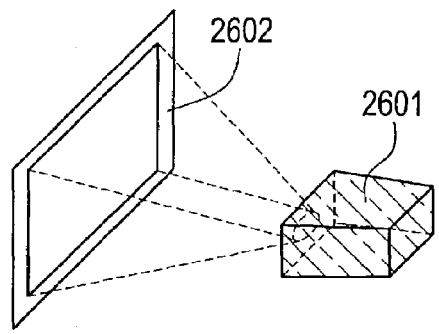
FIGS. 25(A) through 25(D) are schematic views each showing an example of electronic equipment.

FIG. 25A shows a front type projector that is comprised of a projection unit 2601, a screen 2602, and the like. The present invention can be applied to a liquid crystal display device 2808 which is a part structuring the projection unit 2601 and other signal control circuit.

Figure 25B:
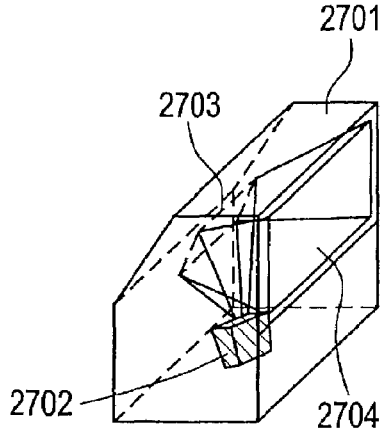

FIG. 25B shows a rear type projector that is comprised of a main body 2701, a projection unit 2702, a mirror 2703, a screen 2704, and the like. The present invention can be applied to the liquid crystal display device 2808 which is a part structuring the projection unit 2702 and other signal control circuit.

Figure 25C:
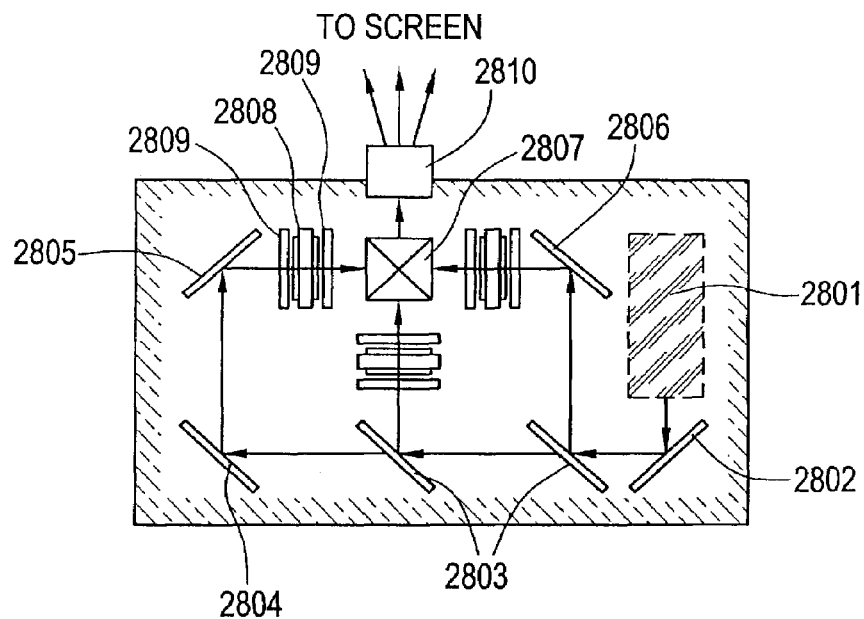

Illustrated in FIG. 25C is an example of the structure of the projection units 2601 and 2702 that are shown in FIGS. 25A and 25B, respectively. Each of the projection units 2601 and 2702 is comprised of a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 is constructed of an optical system including projection lenses. An example of a three plate system is shown in the present embodiment, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 25C.

Figure 25D:
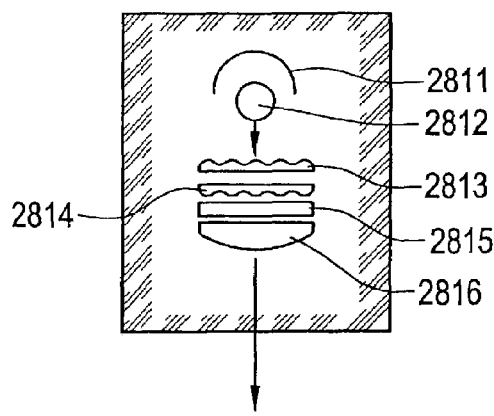

In addition, FIG. 25D shows an example of the structure of the light source optical system 2801 of FIG. 25C. In the present embodiment, the light source optical system 2801 is composed of a reflector 2811, a light source 2812, a lens array 2813 and 2814, a polarizing conversion element 2815, and a condenser lens 2816. Note that the light source optical system shown in FIG. 25D is an example, and it is not limited to the illustrated structure. For example, the operator may suitably set optical systems such as optical lenses, polarizing film, film to regulate the phase difference, and IR film.

The projector illustrated in FIG. 25, show the electro optical device of transparent type but the example of the electro optical device of reflection type and the EL display device.

Figure 26A:
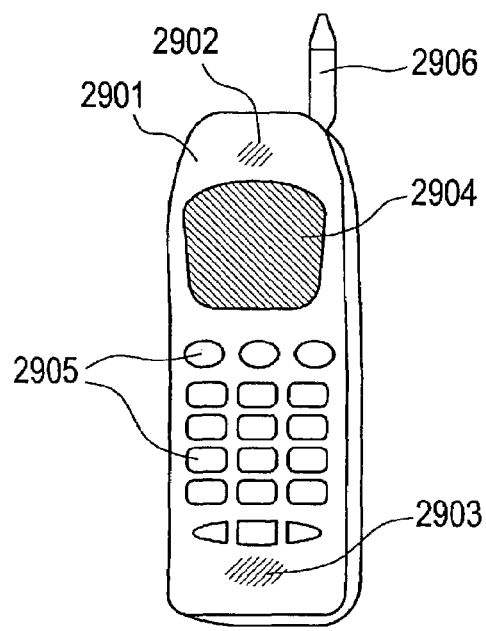
FIGS. 26(A) through 26(C) are schematic views each showing an example of electronic equipment.

FIG. 26A shows a cellular phone that is comprised of a main body 2901, an audio output portion 2902, an audio input portion 2903, a display portion 2904, an operation switches 2905 and an antenna 2906 etc. The present invention can be applied to the audio output portion 2902, the audio input portion 2903, the display portion 2904 and other signal control circuit.

Figure 26B:
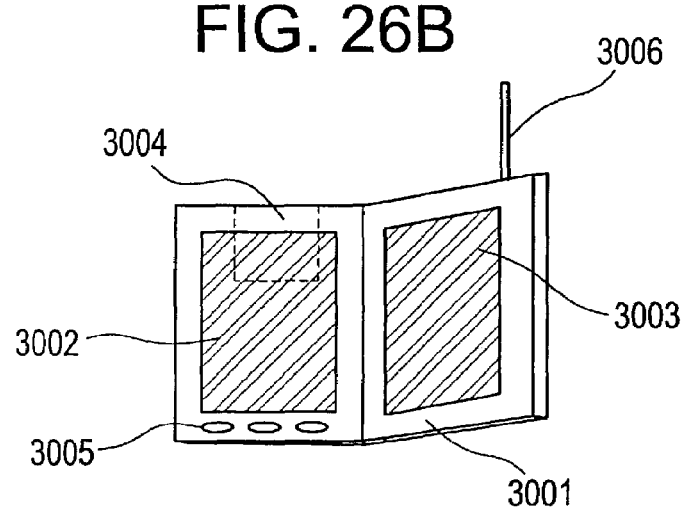

FIG. 26B shows a mobile book (electronic book) that is comprised of a main body 3001, a display portion 3002, 3003, a recording medium 3004, an operation switches 3005 and a antenna 3006 etc. The present invention can be applied to the display portion 3002, 3003 and other signal control circuit.

Figure 26C:
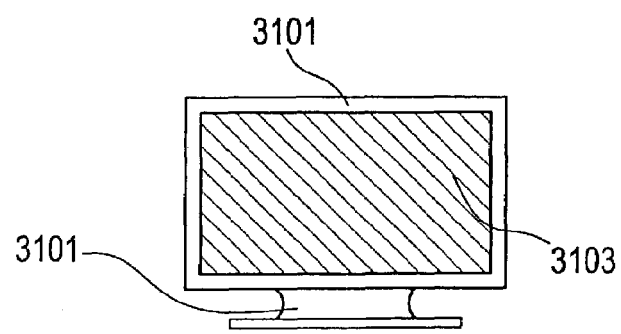

FIG. 26C shows a display that is comprised of a main body 3101, a support stand 3102 and display portion 3103 etc. The present invention can be applied to the display portion 3103. They are especially advantageous for cases in which the screen is made large, and is favorable for displays having a diagonal greater than or equal to 10 inches (especially one which is greater than or equal to 30 inches).

Thus, the application range for the present invention is extremely wide, and it may be applied to electronic equipment in all fields. Further, the electronic equipment of this Embodiment can be realized with a composition that uses any combination of Embodiments 1 to 11.

Embodiment 13

An experiment was conducted in this embodiment. The steps of the experiment in this embodiment will now be described with reference to FIGS. 27(A)-27(C).

First, a BCB film being 200 nm thick was formed on a glass substrate 1400 and was patterned using the same mask as that of a semiconductor layer to be formed later, whereby a BCB film 1401 was formed.

Subsequently, using plasma CVD, an oxidized silicon nitride film 1402 (at a composition ratio of Si=32%, O=59%, N=7% and H=2%) formed by employing $SiH_4$ and $N_2O$ as a reaction gas was stacked on the BCB film 1401 to a thickness of 200 nm.

Figure 27A:
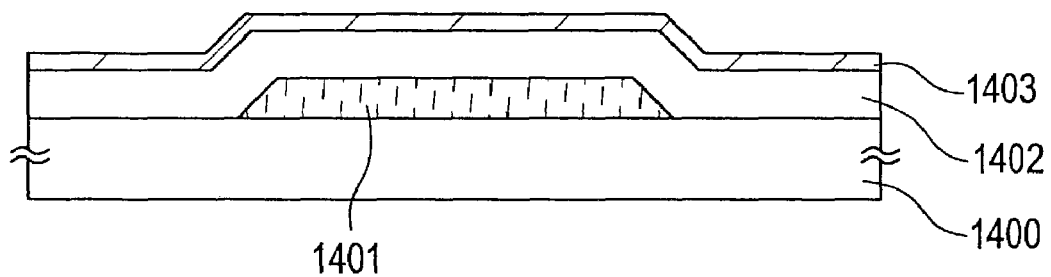
FIGS. 27(A) through 27(C) are sectional views showing a fabricating process according to the invention.

Next, the amorphous silicon film 1403 being 54 nm thick was formed by employing plasma CVD in this embodiment (FIG. 27(A)).

Figure 27B:
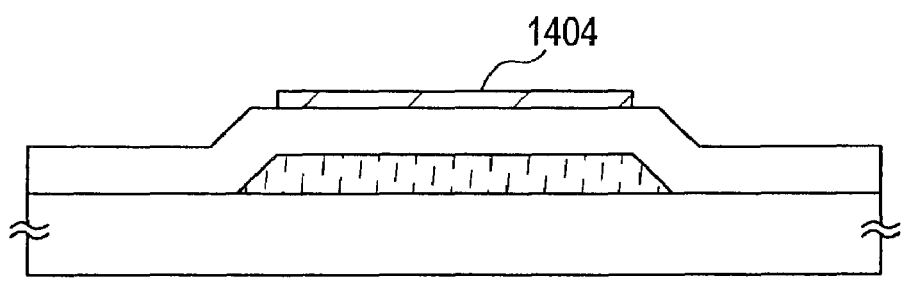
Figure 27C:
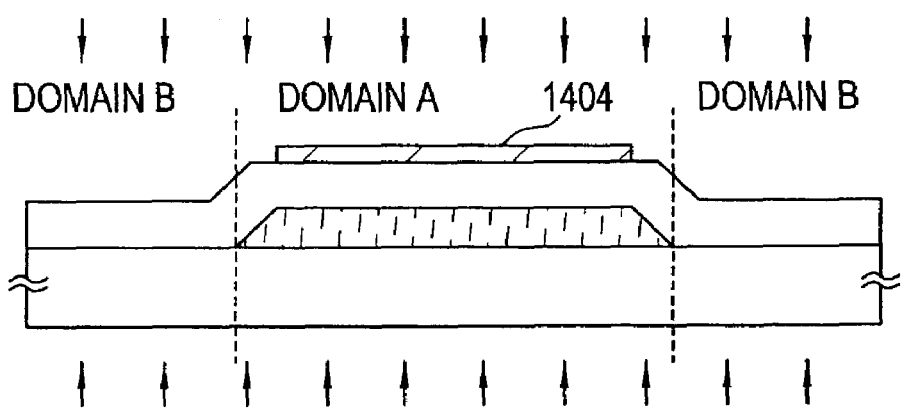

The amorphous silicon film 1403 was dehydrogenated (at 500° C. for one hour), and was thereafter patterned (FIG. 27(B)).

Subsequently, natural oxide films were removed with buffer hydrofluoric acid, and laser annealing in this embodiment was carried out. Then, a crystalline silicon film 1404 was formed (FIG. 27(C)).

Needless to say, the step of forming the crystalline silicon film 1404 can be used instead of the step of forming the crystalline silicon film as stated in any of Embodiments 1 through 11.

Figure 28:
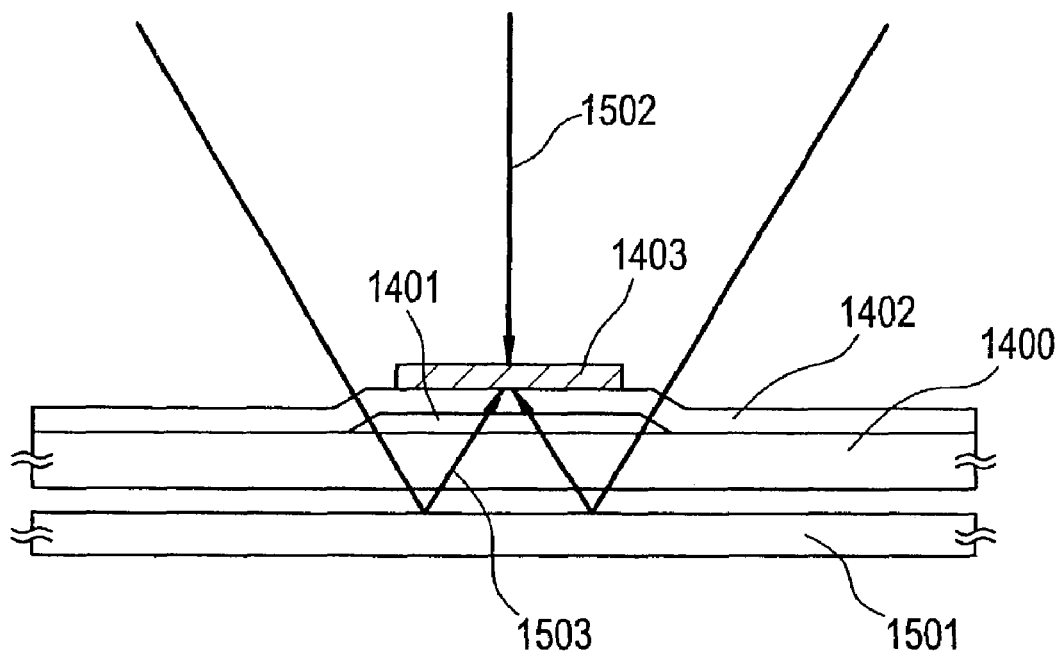
FIG. 28 is a schematic sectional view showing a laser irradiation method according to the invention.

The laser annealing in this embodiment was such that the front surface and back surface of the amorphous silicon film 1403 were irradiated with excimer laser beams 1502, 1503 (at a wavelength of 308 nm) by a method illustrated in FIG. 28. Here, the whole surface of the substrate structure formed with the amorphous silicon film 1403 was irradiated with the rectilinear beams under the conditions of an energy density of 100 mJ/cm$^2$-500 mJ/cm$^2$ and a scanning-beam overlap proportion of 80%-98%. Although a glass substrate (Glass #1737 manufactured by Corning Incorporated) exhibiting a transmission factor of about 50% for the excimer laser at the lasing wave length of 308 nm was employed here, a quartz substrate exhibiting a transmission factor of about 100% for the same may well be employed.

Referring to FIG. 28, numeral 1400 designates a light-transmissive substrate, on which a BCB film 1401, an insulating film 1402 and an amorphous semiconductor film (or microcrystal semiconductor film) 1403 are formed. Besides, a reflector 1501 for reflecting the laser light is arranged under the light-transmissive substrate 1400.

Usable as the light-transmissive substrate 1400 is a glass substrate, a quartz substrate, a crystallized glass substrate or a plastics substrate. The effective energy intensity of the secondary laser light can be regulated by the light-transmissive substrate 1400 itself. Besides, the insulating film 1402 may be formed of an insulating film containing silicon, such as a silicon oxide film or a nitrified silicon oxide film ($SiO_xN_y$). The effective energy intensity of the secondary laser light may well be regulated by the insulating film 1402.

Besides, in the construction of FIG. 28, the secondary laser light 1503 is the laser light reflected by the reflector 1501. Accordingly, the effective energy intensity of the secondary laser light can also be regulated by the amorphous semiconductor film 1403. Also, the amorphous semiconductor film 1403 includes, not only an amorphous silicon film, but also a compound semiconductor film such as an amorphous silicon-germanium film.

In addition, the reflector 1501 may be either of a board whose surface (reflective surface for the laser light) is formed with a metal film, and a board which is made of a metal element. In this case, any material may be employed for the metal film. Typically used is a metal film which contains any element selected from the group consisting of silicon (Si), aluminum (Al), silver (Ag), tungsten (W), titanium (Ti) and tantalum (Ta). It is allowed to employ, for example, tungsten nitride (WN), titanium nitride (TiN) or tantalum nitride (TaN).

Further, the reflector 1501 may be disposed in touch with the light-transmissive substrate 1400, or with a spacing therefrom. The provision of the reflector 1501 can also be replaced with a metal film as mentioned above, which is formed directly on the back surface of the substrate 1400 (opposite to the front surface thereof) so as to reflect the laser light. Anyway, the effective energy intensity of the secondary laser light can be regulated by the reflectivity of the reflector 1501. Besides, in the case where the reflector 1501 is disposed with the spacing from the light-transmissive substrate 1400, the energy intensity of the secondary laser light can be controlled by a gas with which the gap or interspace is filled up.

Needless to say, the above laser annealing can be used instead of the laser annealing as stated in any of Embodiments 1 through 11.

Figure 29:
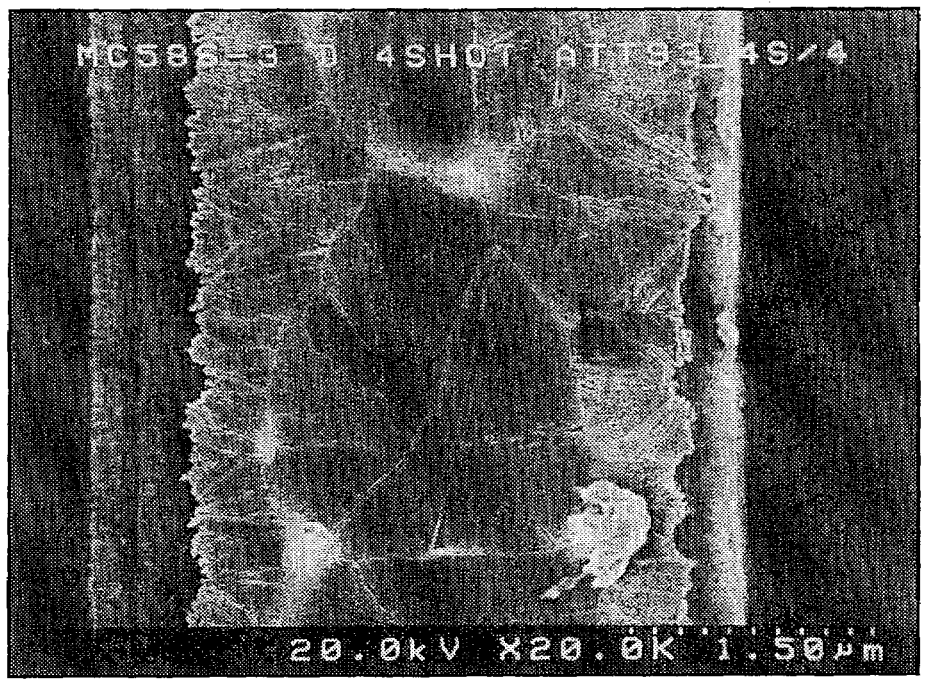
FIG. 29 is an SEM photograph diagram showing the sizes of crystal grain diameters.

FIG. 29 is an SEM photograph diagram obtained by observing the sizes of crystal grain diameters in the crystalline silicon film which was formed via the above steps. As shown in FIG. 29, the crystalline silicon film formed had the large crystal grain diameters of about 2 μm. When the region of the large grain diameters is employed as the channel forming region of a TFT, the TFT exhibiting good TFT characteristics can be produced.

Figure 30:
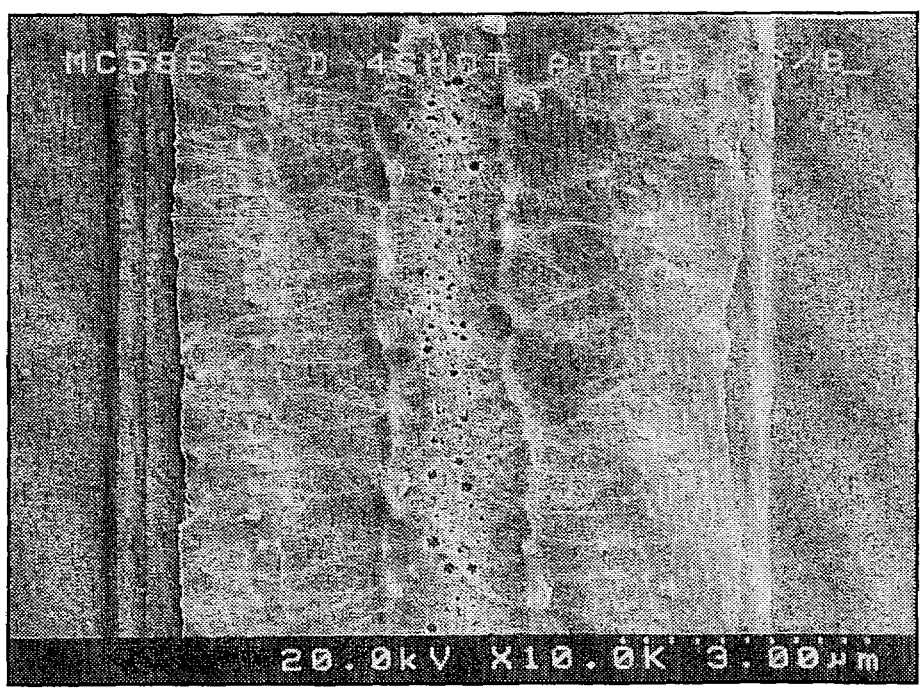
FIG. 30 is an SEM photograph diagram showing the locations of crystal growth.

Besides, FIG. 30 is an SEM photograph diagram obtained by observing the crystalline silicon film which was obtained by patterning a comparatively large island-like semiconductor film and irradiating it with a laser in order to investigate the positions of the starting points of crystal growth. As shown in FIG. 30, the crystalline silicon film formed had been laterally grown from the end parts thereof.

It has been verified from the above experimental results that the locations of crystals in a crystalline semiconductor film can be controlled in accordance with the present invention.

The present invention brings forth effects as stated below.

A crystalline semiconductor film in which the locations of crystals and the sizes of crystal grains have been controlled, can be prepared by adopting the crystallizing technology of the present invention. The positions of the crystalline semiconductor films of large crystal grain diameters are determined by the arrangement of organic resin films having a predetermined shape. Besides, a region of large crystal grain diameters can be formed at a selected position by regulating the material and thickness of the organic resin film or those of an inorganic insulating film. Further, a lattice defect density is very low in the region of large crystal grain diameters, and excellent electric characteristics can be attained in case of employing this region as the channel forming region of a TFT.

What is claimed is:

1. A semiconductor device comprising:
   a substrate;
   a base film over said substrate, wherein said base film comprises an organic resin film and an inorganic insulating film provided over said organic resin film; and
   a semiconductor film provided over said base film,
   wherein the semiconductor film comprises a channel forming region.

2. A device according to claim 1, wherein said inorganic insulating film is either of a single-layer film which is selected from the group consisting of a silicon oxide film, a silicon nitride film and an oxidized silicon nitride film, and a multi-layer film which consists of at least two of the single-layer films.

3. A device according to claim 1, wherein said semiconductor device is incorporated into one selected from the group consisting of a liquid crystal display and an EL display.

4. A device according to claim 1, wherein a thermal conductivity of said organic resin film is at most 1.0 $Wm^{-1}K^{-1}$.

5. A device according to claim 1, wherein said organic resin film has a photosensitivity.

6. A device according to claim 1, wherein said organic resin film is either of a single-layer film which is made of a material selected from the group consisting of a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

7. A device according to claim 1, wherein said semiconductor device is one selected from the group consisting of a personal computer, a video camera, a mobile computer, a goggle type display, a player using a recording medium, a cellular phone, an electronic book, a portable information terminal, a digital camera, and a projector.

8. A device according to claim 1, wherein said organic resin film has a shape of an island.

9. A semiconductor device comprising:
a substrate;
an insulating film provided over said substrate;
an organic resin film provided over said insulating film;
an inorganic insulating film provided over said organic resin film; and
a semiconductor film provided over said inorganic insulating film,
wherein the semiconductor film comprises a channel forming region.

10. A device according to claim 9, wherein said insulating film comprises a material selected from the group consisting of a silicon oxide, a silicon nitride and an oxidized silicon nitride.

11. A device according to claim 9, wherein said inorganic insulating film is either of a single-layer film which is selected from the group consisting of a silicon oxide film, a silicon nitride film and an oxidized silicon nitride film, and a multi-layer film which consists of at least two of the single-layer films.

12. A device according to claim 9, wherein said semiconductor device is incorporated into one selected from the group consisting of a liquid crystal display and an EL display.

13. A device according to claim 9, wherein a thermal conductivity of said organic resin film is at most $1.0 \text{ Wm}^{-1}\text{K}^{-1}$.

14. A device according to claim 9, wherein said organic resin film has a photosensitivity.

15. A device according to claim 9, wherein said organic resin film is either of a single-layer film which is made of a material selected from the group consisting of a BOB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

16. A device according to claim 9, wherein said semiconductor device is one selected from the group consisting of a personal computer, a video camera, a mobile computer, a goggle type display, a player using a recording medium, a cellular phone, an electronic book, a portable information terminal, a digital camera, and a projector.

17. A device according to claim 9, wherein said organic resin film has a shape of an island.

18. A semiconductor device comprising:
a substrate;
an organic resin island provided over said substrate;
an inorganic insulating film provided over said organic resin island;
a semiconductor island provided over said inorganic insulating film, said semiconductor island comprising a channel region; and
a gate electrode provided over said channel region with a gate insulating film therebetween,
wherein said organic resin island overlaps with said semiconductor island.

19. A device according to claim 18, wherein said gate electrode comprises a material selected from the group consisting of tantalum, titanium, molybdenum, tungsten, an Mo—W alloy, an Mo—Ta alloy, tantalum nitride, tungsten nitride, titanium nitride, molybdenum nitride, tungsten silicide, titanium silicide and molybdenum silicide.

20. A device according to claim 18, wherein said inorganic insulating film is either of a single-layer film which is selected from the group consisting of a silicon oxide film, a silicon nitride film and an oxidized silicon nitride film, and a multi-layer film which consists of at least two of the single-layer films.

21. A device according to claim 18, wherein said semiconductor device is incorporated into one selected from the group consisting of a liquid crystal display and an EL display.

22. A device according to claim 18, wherein a thermal conductivity of said organic resin island is at most $1.0 \text{ Wm}^{-1}\text{K}^{-1}$.

23. A device according to claim 18, wherein said organic resin island has a photosensitivity.

24. A device according to claim 18, wherein said organic resin island is either of a single-layer film which is made of a material selected from the group consisting of a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

25. A device according to claim 18, wherein said semiconductor device is one selected from the group consisting of a personal computer, a video camera, a mobile computer, a goggle type display, a player using a recording medium, a cellular phone, an electronic book, a portable information terminal, a digital camera, and a projector.

26. A device according to claim 18, wherein a position of said organic resin island is in conformity with a position of said semiconductor island.

27. A semiconductor device comprising:
a substrate;
an organic resin film provided over said substrate;
an inorganic insulating film provided over said organic resin film;
a semiconductor film provided over said inorganic insulating film;
a gate insulating film provided over said semiconductor film; and
a gate electrode provided over said gate insulating film,
wherein the semiconductor film comprises a channel forming region.

28. A semiconductor device comprising:
a substrate;
an organic resin film provided over said substrate;
an inorganic insulating film provided over said organic resin film;
a semiconductor film provided over said inorganic insulating film;
wherein an area on the surface of said organic resin film is larger than an area on the surface of said semiconductor film,
a gate insulating film provided over said semiconductor film; and
a gate electrode provided over said gate insulating film,
wherein the semiconductor film comprises a channel forming region.

29. A semiconductor device comprising:
a substrate;
an insulating film provided over said substrate;
an organic resin film provided over said insulating film;
an inorganic insulating film provided over said organic resin film;
a semiconductor film provided over said inorganic insulating film;
a gate insulating film provided over said semiconductor film; and
a gate electrode provided over said gate insulating film,
wherein the semiconductor film comprises a channel forming region.

30. A semiconductor device comprising:
a substrate;
an insulating film provided over said substrate;
an organic resin film provided over said insulating film;
an inorganic insulating film provided over said organic resin film;
a semiconductor film provided over said inorganic insulating film;
wherein an area on the surface of said organic resin film is larger than an area on the surface of said semiconductor film,
a gate insulating film provided over said semiconductor film; and
a gate electrode provided over said gate insulating film,
wherein the semiconductor film comprises a channel forming region.

31. A device according to claim 27, wherein said inorganic insulating film is either of a single-layer film which is selected from the group consisting of a silicon oxide film, a silicon nitride film and an oxidized silicon nitride film, and a multilayer film which consists of at least two of the single-layer films.

32. A device according to claim 27, wherein said semiconductor device is incorporated into one selected from the group consisting of a liquid crystal display and an EL display.

33. A device according to claim 27, wherein a thermal conductivity of said organic resin film is at most $1.0\,\mathrm{Wm^{-1}K^{-1}}$.

34. A device according to claim 27, wherein said organic resin film has a photosensitivity.

35. A device according to claim 27, wherein said organic resin film is either of a single-layer film which is made of a material selected from the group consisting of a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

36. A device according to claim 27, wherein said semiconductor device is one selected from the group consisting of a personal computer, a video camera, a mobile computer, a goggle type display, a player using a recording medium, a cellular phone, an electronic book, a portable information terminal, a digital camera, and a projector.

37. A device according to claim 27, wherein said organic resin film has a shape of an island.

38. A device according to claim 28, wherein said inorganic insulating film is either of a single-layer film which is selected from the group consisting of a silicon oxide film, a silicon nitride film and an oxidized silicon nitride film, and a multilayer film which consists of at least two of the single-layer films.

39. A device according to claim 28, wherein said semiconductor device is incorporated into one selected from the group consisting of a liquid crystal display and an EL display.

40. A device according to claim 28, wherein a thermal conductivity of said organic resin film is at most $1.0\,\mathrm{Wm^{-1}K^{-1}}$.

41. A device according to claim 28, wherein said organic resin film has a photosensitivity.

42. A device according to claim 28, wherein said organic resin film is either of a single-layer film which is made of a material selected from the group consisting of a BOB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

43. A device according to claim 28, wherein said semiconductor device is one selected from the group consisting of a personal computer, a video camera, a mobile computer, a goggle type display, a player using a recording medium, a cellular phone, an electronic book, a portable information terminal, a digital camera, and a projector.

44. A device according to claim 28, wherein said organic resin film has a shape of an island.

45. A device according to claim 29, wherein said insulating film comprises a material selected from the group consisting of a silicon oxide, a silicon nitride and an oxidized silicon nitride.

46. A device according to claim 29, wherein said inorganic insulating film is either of a single-layer film which is selected from the group consisting of a silicon oxide film, a silicon nitride film and an oxidized silicon nitride film, and a multilayer film which consists of at least two of the single-layer films.

47. A device according to claim 29, wherein said semiconductor device is incorporated into one selected from the group consisting of a liquid crystal display and an EL display.

48. A device according to claim 29, wherein a thermal conductivity of said organic resin film is at most $1.0\,\mathrm{Wm^{-1}K^{-1}}$.

49. A device according to claim 29, wherein said organic resin film has a photosensitivity.

50. A device according to claim 29, wherein said organic resin film is either of a single-layer film which is made of a material selected from the group consisting of a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

51. A device according to claim 29, wherein said semiconductor device is one selected from the group consisting of a personal computer, a video camera, a mobile computer, a goggle type display, a player using a recording medium, a cellular phone, an electronic book, a portable information terminal, a digital camera, and a projector.

52. A device according to claim 29, wherein said organic resin film has a shape of an island.

53. A device according to claim 30, wherein said insulating film comprises a material selected from the group consisting of a silicon oxide, a silicon nitride and an oxidized silicon nitride.

54. A device according to claim 30, wherein said inorganic insulating film is either of a single-layer film which is selected from the group consisting of a silicon oxide film, a silicon nitride film and an oxidized silicon nitride film, and a multilayer film which consists of at least two of the single-layer films.

55. A device according to claim 30, wherein said semiconductor device is incorporated into one selected from the group consisting of a liquid crystal display and an EL display.

56. A device according to claim 30, wherein a thermal conductivity of said organic resin film is at most $1.0\,\mathrm{Wm^{-1}K^{-1}}$.

57. A device according to claim 30, wherein said organic resin film has a photosensitivity.

58. A device according to claim 30, wherein said organic resin film is either of a single-layer film which is made of a material selected from the group consisting of a BCB (benzocyclobutene) resin, a polyimidic resin (fluorinated polyimide), an acrylic resin, a siloxanic resin, fluorinated paraxylene, fluorinated parylene, Teflon, fluoropolyallyl ether, PFCB and polysilazane, and a multilayer film which consists of at least two of the single-layer films.

59. A device according to claim 30, wherein said semiconductor device is one selected from the group consisting of a personal computer, a video camera, a mobile computer, a goggle type display, a player using a recording medium, a cellular phone, an electronic book, a portable information terminal, a digital camera, and a projector.

60. A device according to claim 30, wherein said organic resin film has a shape of an island.

* * * * *